US 6,524,755 B2

(12) United States Patent
Jin et al.

(10) Patent No.: US 6,524,755 B2
(45) Date of Patent: Feb. 25, 2003

(54) PHASE-SHIFT MASKS AND METHODS OF FABRICATION

(75) Inventors: Michael S. Jin, Petaluma, CA (US); Sing H. Lee, Del Mar, CA (US); James A. Reynolds, Sunnyvale, CA (US)

(73) Assignee: Gray Scale Technologies, Inc., San Diego, CA (US)

( * ) Notice: Subject to any disclaimer, the term of this patent is extended or adjusted under 35 U.S.C. 154(b) by 0 days.

(21) Appl. No.: 09/804,590

(22) Filed: Mar. 12, 2001

(65) Prior Publication Data

US 2002/0028392 A1 Mar. 7, 2002

Related U.S. Application Data

(60) Provisional application No. 60/231,162, filed on Sep. 7, 2000.

(51) Int. Cl.[7] .............................. G03F 9/00; B32B 9/00
(52) U.S. Cl. ...................... 430/5; 430/323; 428/408
(58) Field of Search .............................. 430/5, 311, 313, 430/322, 323, 324; 438/424; 428/426, 408

(56) References Cited

U.S. PATENT DOCUMENTS

| 4,526,673 A | 7/1985 | Little et al. |
| 4,728,529 A | 3/1988 | Etzkorn et al. |
| 4,777,090 A | 10/1988 | Ovshinsky et al. |
| 4,783,361 A | 11/1988 | Ovshinsky et al. |
| 4,890,309 A | 12/1989 | Smith et al. |
| 4,972,250 A | 11/1990 | Omori et al. |
| 5,135,808 A | 8/1992 | Kimock et al. |
| 5,171,607 A | 12/1992 | Cumbo |
| 5,246,801 A | 9/1993 | Pierrat |
| 5,391,407 A | 2/1995 | Dearnaley |
| 5,393,572 A | 2/1995 | Dearnaley |
| 5,411,824 A | 5/1995 | Vasudev et al. |
| 5,455,081 A | 10/1995 | Okada et al. |
| 5,465,859 A | 11/1995 | Chapple-Sokol et al. |
| 5,470,661 A | 11/1995 | Bailey et al. |
| 5,470,681 A | 11/1995 | Brunner et al. |
| 5,472,811 A | 12/1995 | Vasudev et al. |
| 5,474,864 A | 12/1995 | Isao et al. |
| 5,475,074 A | 12/1995 | Matsuoka et al. |
| 5,477,058 A | 12/1995 | Sato |
| 5,508,368 A | 4/1996 | Knapp et al. |
| 5,532,089 A | 7/1996 | Adair et al. |
| 5,556,931 A | 9/1996 | Imura et al. |
| 5,565,286 A | 10/1996 | Lin |
| 5,567,550 A | 10/1996 | Smayling |
| 5,569,501 A | 10/1996 | Bailey et al. |
| 5,614,336 A | 3/1997 | Mikami et al. |

(List continued on next page.)

FOREIGN PATENT DOCUMENTS

EP   724 022 A1   7/1996

*Primary Examiner*—S. Rosasco
(74) *Attorney, Agent, or Firm*—Townsend and Townsend and Crew LLP

(57) ABSTRACT

Multilayer film stacks and gray scale processing methods are employed for fabricating phase-shifting masks (PSMs) utilized in lithography. Desired optical transmission and phase-shifting functions of the mask are achieved by controlling the optical properties and thickness of constituent film layers. The mask can be tuned for optimal performance at various wavelengths to an extent beyond that obtainable using a single layer film to control both attenuation and phase shifting of incident light. The processing methods exploit multi-level electron beam or optical beam lithography techniques, and the etch selectivity afforded by selection of appropriate materials for the film stack, to obtain improved yields and reduced processing costs for fabrication of PSMs. In particular, diamond-like carbon (DLC) materials formed by ion beam deposition and having a stress of 1 GPa or less are utilized as etch stop layers.

53 Claims, 13 Drawing Sheets

U.S. PATENT DOCUMENTS

| | | | |
|---|---|---|---|
| 5,618,619 A | 4/1997 | Petrmichl et al. |
| 5,629,114 A | 5/1997 | Isao et al. |
| 5,635,245 A | 6/1997 | Kimock et al. |
| 5,635,315 A | 6/1997 | Mitsui |
| 5,691,090 A | 11/1997 | Isao et al. |
| 5,718,976 A | 2/1998 | Dorfman et al. |
| 5,723,234 A | 3/1998 | Yokoyama et al. |
| 5,780,119 A | 7/1998 | Dearnaley et al. |
| 5,824,438 A | 10/1998 | Choi et al. |
| 5,824,439 A | 10/1998 | Lee |
| 5,830,332 A | 11/1998 | Babich et al. |
| 5,846,649 A | 12/1998 | Knapp et al. |
| 5,853,923 A | 12/1998 | Tzu |
| 5,858,477 A | 1/1999 | Veerasamy et al. |
| 5,869,212 A | 2/1999 | Hashimoto et al. |
| 5,888,593 A | 3/1999 | Petrmichl et al. |
| 5,897,976 A | 4/1999 | Carcia et al. |
| 5,914,202 A | 6/1999 | Nguyen et al. |
| 5,914,204 A | 6/1999 | Lee |
| 5,932,377 A | 8/1999 | Ferguson et al. |
| 5,935,735 A | 8/1999 | Okubo et al. |
| 5,935,740 A | 8/1999 | Pierrat |
| 5,939,225 A | 8/1999 | Dove et al. |
| 5,939,227 A | 8/1999 | Smith |
| 5,973,447 A | 10/1999 | Mahoney et al. |
| 6,007,324 A | 12/1999 | Tzu et al. |
| 6,027,837 A | 2/2000 | Adair et al. |
| 6,030,904 A | 2/2000 | Grill et al. |
| 6,051,345 A | 4/2000 | Huang |
| 6,077,569 A | 6/2000 | Knapp et al. |
| 6,086,796 A | 7/2000 | Brown et al. |
| 6,086,962 A | 7/2000 | Mahoney et al. |
| 6,107,000 A | 8/2000 | Lee et al. |
| 6,132,908 A | 10/2000 | Shiraishi et al. |
| 6,136,386 A | 10/2000 | Nakahigashi et al. |
| 6,151,915 A | 11/2000 | Hirota et al. |
| H1924 H | 12/2000 | Zabinski et al. |
| 6,156,394 A | 12/2000 | Yamasaki et al. |
| 6,348,395 B1 * | 2/2002 | Clevenger et al. ......... 438/424 |

* cited by examiner

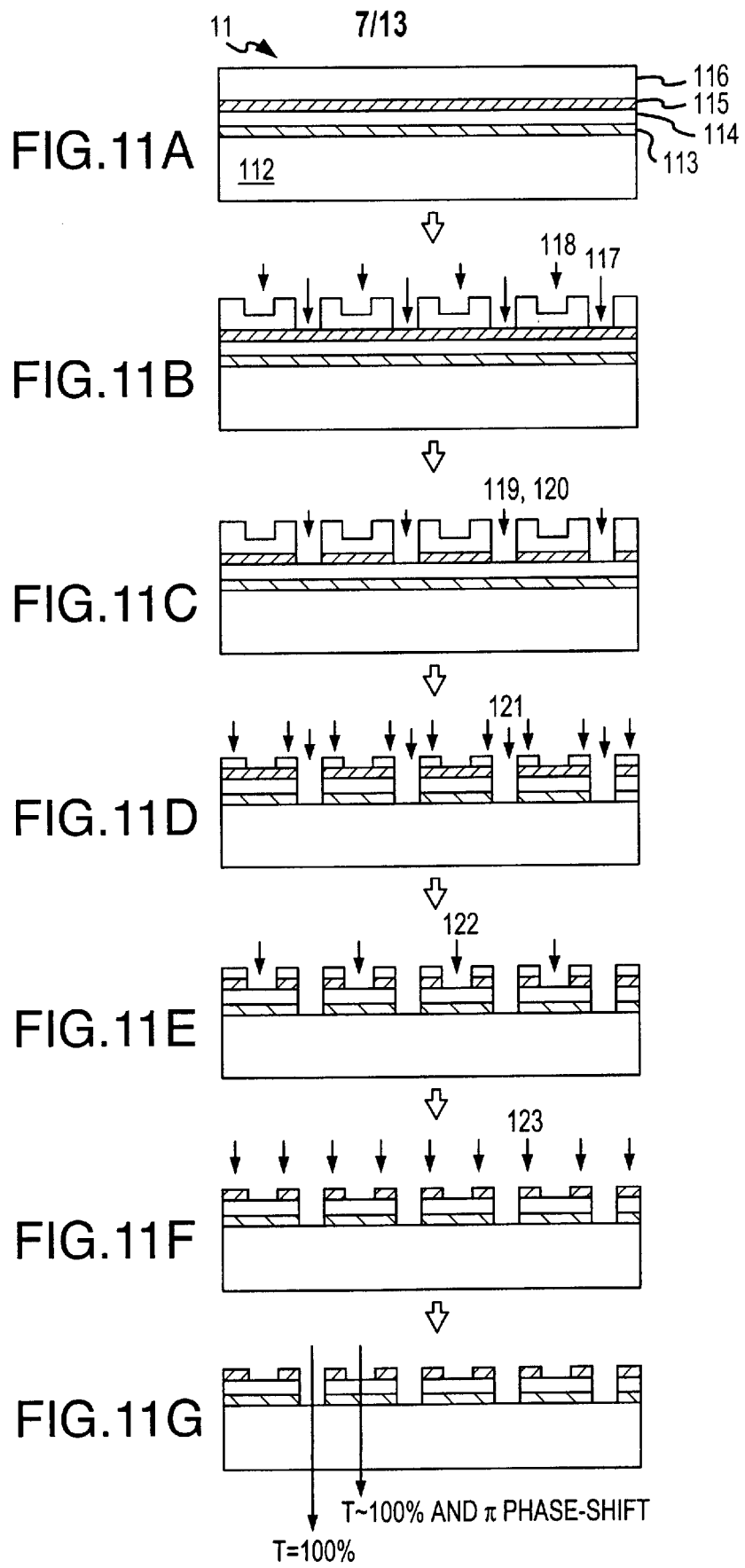

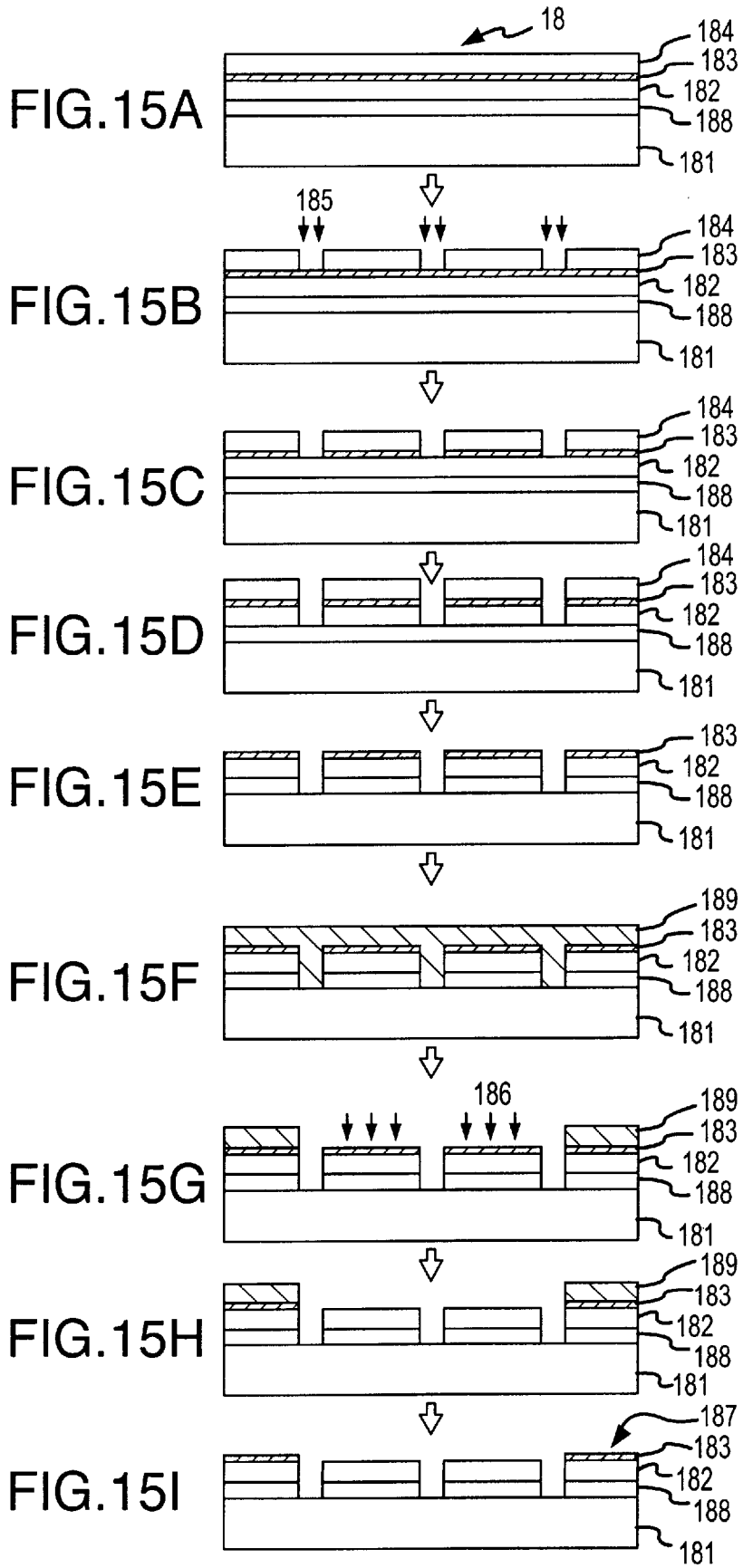

PHASE-SHIFT MASKS AND METHODS OF FABRICATION

CROSS-REFERENCE TO RELATED APPLICATION

The present application claims priority from U.S. provisional patent application No. 60/231,162, filed Sep. 7, 2000. The text of this provisional patent application is hereby incorporated by reference.

BACKGROUND OF THE INVENTION

The present invention relates to the manufacture of electronic devices, and more particularly to the formation of masks employed to fabricate integrated circuits having small features sizes.

As the integrated circuit (IC) manufacturing industry moves toward smaller device dimensions, the resolution enhancement techniques (RET) for optical lithography such as off-axis illumination (OAI), optical proximity correction (OPC) and phase-shifting mask (PSM) have been implemented in conjunction with reducing the wavelength of optical exposure. Lithography at shorter wavelengths imposes a particular challenge for PSM fabrication because the inherent functions of PSMs require optical and physical property control. Thus while OAI is applied at the optical relay system level and OPC often requires only binary transmission, PSMs must generally accurately modify both transmission and phase functions of incident light at the device level. At present, implementation of phase-shifting to fabricate small features consumes much of the cost of manufacturing masks employed to fabricate ICs having present-day critical dimensions.

There are various types of standard PSMs, including alternating aperture PSMs (AAPSMs) and embedded-attenuating PSMs (EAPSMs).

FIG. 1 shows a simplified cross-sectional view of an AAPSM with phase shifting features defined on a UV transparent substrate. AAPSM 1 with phase shifting features is defined on a UV transparent substrate 11 with Cr coating 12. Openings 13 and 14 with thickness difference d such that phase difference between light transmitted through un-shifted opening 15 and phase-shifted opening 16 is 180°. "n" is the refractive index of the substrate 11.

FIG. 2 shows a simplified cross-sectional view of an EAPSM with partially transmitting film. EAPSM 2 has partially transmitting film 23 that shifts the phase of transmitted light by 180°. EAPSM 2 is built on a UV transparent substrate 21, which is coated with molybdenum silicon-oxynitride ($MoSi_xO_yN_z$) complex 23 and over-coated with a chromium (Cr) layer 22. $MoSi_xO_yN_z$ layer 23 attenuates and phase-shifts incident beam 25 relative to the unaltered beam 26.

Fabrication of EAPSMs often requires that mask blanks be coated with a partially absorbing film that shifts the phase of the optical wavefront incident by 180° with respect to the coincident wavefront that transmits through the part of the mask not covered by the film (see FIG. 2). This phase difference:

$$\Delta\phi = 2\pi[n(\lambda)-1]d/\lambda, \text{ where:}$$

$\Delta\phi$=phase difference;
$n(\lambda)$=refractive index of the film at a given stepper wavelength $\lambda$; and
d=film thickness, causes the adjacent wavefronts to destructively interfere with each other. In addition to altering the phase, amplitudes of the two wavefronts near the edge of critical features should be matched with appropriate film absorption in order to achieve desirable destructive interference.

Transmission by the partially transmitting film is given by $$T = T_O \exp[-4\pi k(\lambda)d/\lambda], \text{ where:}$$

$T_O$=initial value of transmission
$k(\lambda)$=the imaginary component of the refractive index at a particular wavelength $\lambda$; and
d=film thickness, with d determined by the 180° phase difference requirement. For a given wavelength, one should control the imaginary component $k(\lambda)$, of the refractive index of the film material by controlling its stoichiometry and composition. This task is complicated by the fact that any change in $k(\lambda)$ will modify the real component of refractive index $n(\lambda)$, as the two quantities are mathematically linked by the Kramers-Kronig equation. Consequently, utilizing a single film layer solution will in general not readily lead to arbitrary control over both phase and amplitude.

FIG. 3 shows a cross-sectional view of a mask blank 3 comprising a layer of $MoSi_xO_yN_z$ 32 and Cr 33 deposited on UV-grade quartz substrate 31. Mask blanks comprising a single layer of $MoSi_xO_yN_z$ have been used for fabricating 248 nm EAPSMs. However, the etch selectivity of $MoSi_xO_yN_z$ relative to substrate 31 and the optical properties of mask blank 3 may not be sufficient for applications at or below 193 nm wavelength.

FIGS. 4A–4I show simplified cross-sectional views of multiple lithography and processing steps for fabricating AAPSMs. In FIGS. 4A–4I, multiple lithography and processing steps are utilized in fabricating AAPSMs using Cr coated mask blanks. Mask blank 4 comprises an electron-beam or optical-beam sensitive resist 43 coated on top of a Cr coating 42 on a UV transparent substrate 41. The blanks are subjected to lithography processes 44 and 45 (which may be optical or electron-beam in nature) in combination with wet and dry etching steps to define phase-shifting features.

FIGS. 5A–5I show simplified cross-sectional views of multiple lithography and processing steps for fabricating EAPSMs. In FIGS. 5A–5I multiple lithography and processing steps are utilized in fabricating EAPSMs using $MoSi_xO_yN_z$ coated mask blank 5. UV transparent substrate 51 is coated with $MoSi_xO_yN_z$ layer 52, Cr layer 53 and then a layer of electron-beam or optical-beam sensitive resist 54. The blank is then subjected to lithography processes 55 and 56 (which may be either electron-beam or optical-beam) with wet and dry etching steps to define embedded-attenuating phase-shifting features.

As illustrated in FIGS. 4A–4I for formation of AAPSMs and in FIGS. 5A–5I for formation of EAPSMs, PSM fabrication methods typically require about eight processing steps, as well as two separate electron/optical beam lithography steps with intervening processing. Each process step exhibits a certain defect rate, and multiple writing with in-between processing generally requires careful wafer handling that can lead to yield problems.

Therefore, there is a need in the art for simple and economical methods and structures for manufacturing PSMs.

SUMMARY OF THE INVENTION

The present invention relates to the use of multilayer film stacks and gray scale processing methods to fabricate phase-shifting masks (PSMs) utilized in lithography. Desired optical transmission and phase-shifting functions of the mask are achieved by controlling the optical properties and thickness of constituent film layers. By substantially separating the phase shift and attenuation functions between different film layers, the phase shift mask of embodiments of the present invention can be tuned for optimal performance at various wavelengths more precisely than conventional masks employing a single layer to control both attenuation and phase shifting.

Structures and methods in accordance with the present invention may exploit etch selectivity afforded by the use of appropriate materials in the film stack to obtain improved yields and reduced processing costs for fabrication of PSMs. Careful selection of the materials comprising the films of the mask blanks ensures that when a first layer is patterned by dry etching using a particular chemical gas, the film underlying the first layer will be etched very slowly by that chemical gas. In this manner, the etching system utilized in mask fabrication exhibits high etch selectivity, with each film of the stack behaving as an etch stop for etching of the overlying film. This etch selective property thus overcomes problems in non-uniform etching commonly associated with dry etching systems. The order of formation of film materials comprising the photomask blanks is thus an important aspect of certain embodiments of the present invention.

Processing methods in accordance with embodiments of the present invention may also exploit multi-level electron beam writing techniques to obtain improved yields and reduced processing costs for fabrication of PSMs. When such gray scale processing methods are applied to multilayer mask blanks in accordance with embodiments of the present invention in order to fabricate PSMs, fewer processing steps are involved, handling of the mask blanks is reduced, PSM fabrication yields are improved, and the cycle or turn-around time is shortened.

By combining the etch selectivity of the multilayer materials and multi-level resist lithography and processing approaches in accordance with particular embodiments of the present invention, it is also possible to produce a single integrated PSM (iPSM) having various combinations of RET features including AAPSM, EAPSM, and OPC.

It is thus one object of the present invention to describe embodiments of multilayer structures that can be utilized to produce PSMs with high etch selectivity, gray-scale electron beam lithography and associated processing steps that simplify PSM fabrication, and iPSM fabrication technology. It is another object of the present invention to describe embodiments by which gray scale electron-beam lithography and associated dry and/or wet processing steps can be employed to simplify the PSM fabrication process using currently available PSM mask blank structures.

One embodiment of a mask blank structure in accordance with the present invention comprises an optically transmissive substrate comprising one of quartz and glass. An etch stop layer overlies the optically transmissive substrate, the etch stop layer comprising a diamond-like carbon (DLC) film. A phase-shift layer overlies the DLC etch stop layer and shifts a phase of transmitted light; the phase shift layer susceptible to a first etching process selective against the DLC etch stop layer, the DLC etch stop layer susceptible to a second etching process selective against the optically transmissive substrate.

Another embodiment of a mask blank structure in accordance with the present invention comprises an optically transmissive substrate selected from the group consisting of glass, quartz, fluorinated glass, and fluorinated quartz. A tuned absorption layer comprising diamond-like carbon (DLC) overlies the optically transmissive substrate layer, the tuned absorption layer altering an amplitude of transmitted light. A phase-compensation-layer overlies the tuned absorption layer, the phase-compensation layer shifting a phase of transmitted light.

An embodiment of a process for forming a phase shift mask comprises providing an optically transmissive substrate, forming a phase-shift layer over the optically transmissive substrate layer, and forming an optically opaque layer over the phase-shift layer. The optically opaque layer is removed selective to the underlying phase-shift layer, and then the phase-shift layer is removed selective to the underlying substrate.

These and other embodiments of the present invention, as well as its advantages and features are described in more detail in conjunction with the text below and attached FIGS.

BRIEF DESCRIPTION OF THE DRAWINGS

FIGS. 11A–11G show simplified cross-sectional views of processing steps of combined application of multilayer structure and gray-scale lithography approaches to form an AAPSM in accordance with one embodiment of the present invention.

FIGS. 15A–15I show a cross-sectional view of steps for forming an EAPSM utilizing a multilayer mask blank in conjunction with conventional multiple lithography steps.

DESCRIPTION OF THE SPECIFIC EMBODIMENTS

Figure 1:
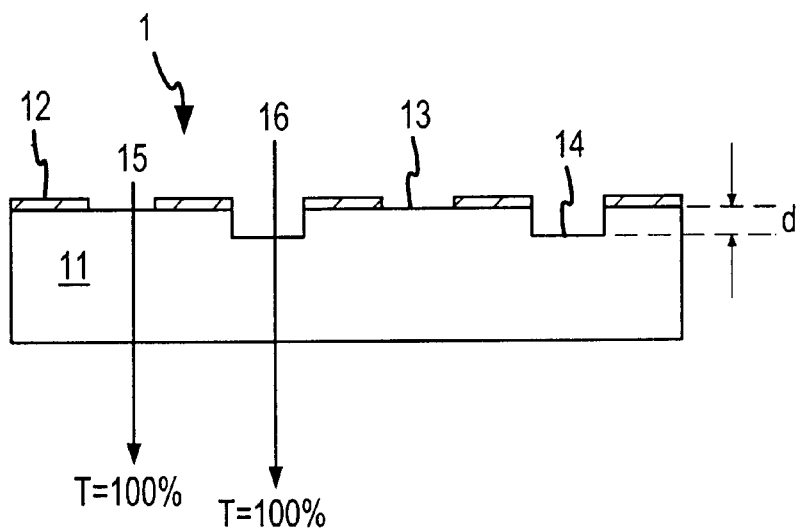
FIG. 1 shows a simplified cross-sectional view of an AAPSM with phase shifting features defined on a UV transparent substrate.
Figure 2:
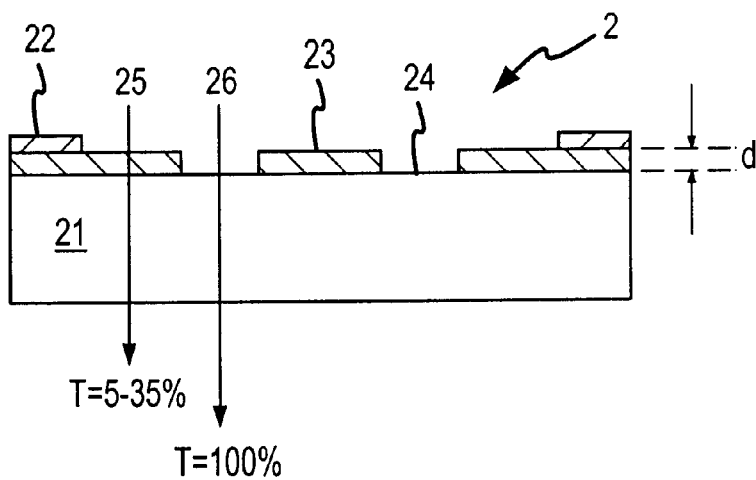
FIG. 2 shows a simplified cross-sectional view of an EAPSM with partially transmitting film
Figure 3:
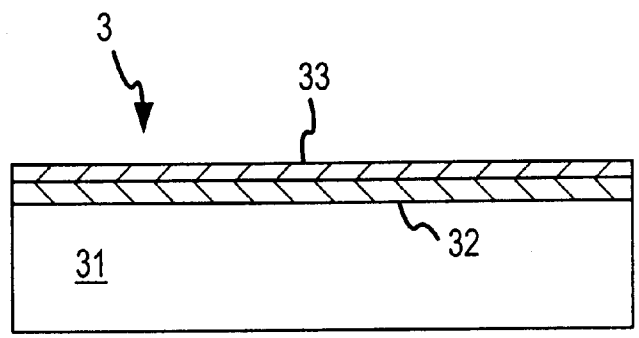
FIG. 3 shows a simplified cross-sectional view of a mask blank.
Figure 4A:
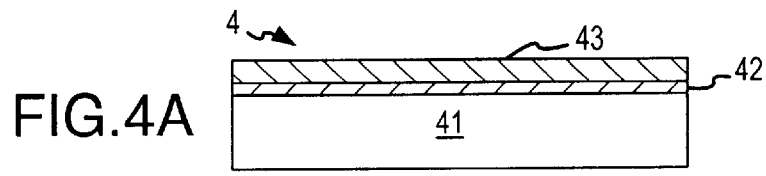
FIGS. 4A–4I show simplified cross-sectional views of multiple lithography and processing steps for fabricating AAPSMs.
Figure 4B:
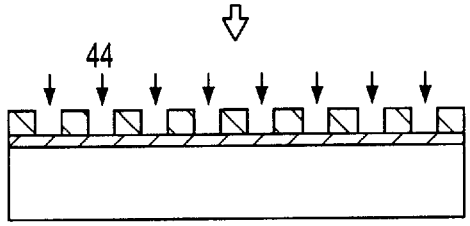
Figure 4C:
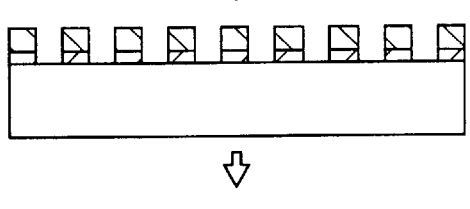
Figure 4D:
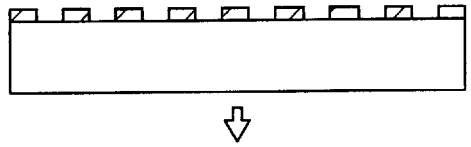
Figure 4E:
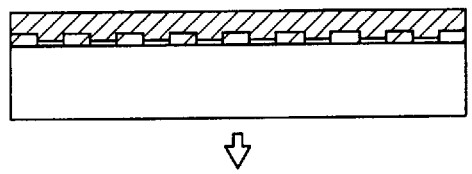
Figure 4F:
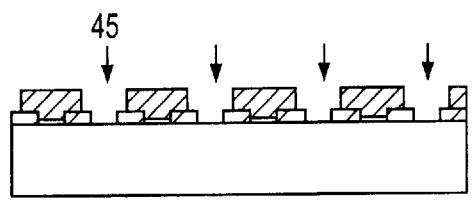
Figure 4G:
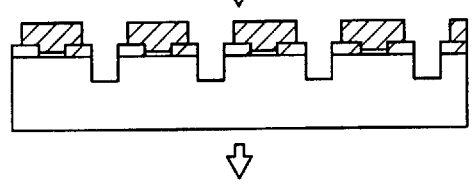
Figure 4H:
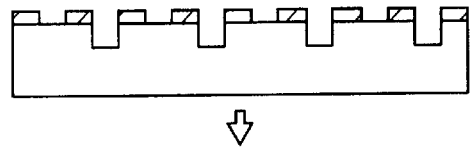
Figure 4I:
Figure 5A:
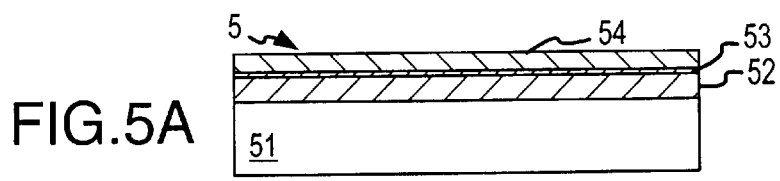
FIGS. 5A–5I show simplified cross-sectional views of multiple lithography and processing steps for fabricating EAPSMs.
Figure 5B:
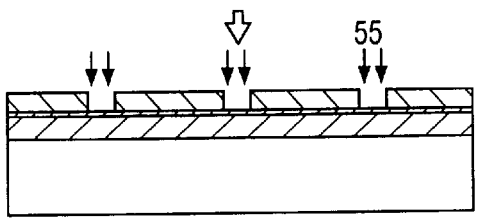
Figure 5C:
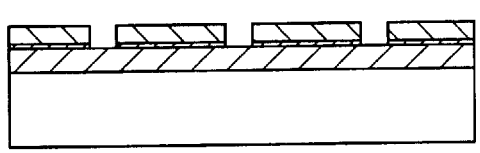
Figure 5D:
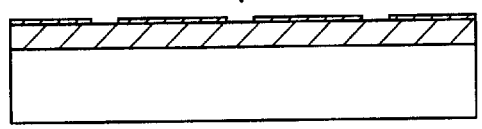
Figure 5E:
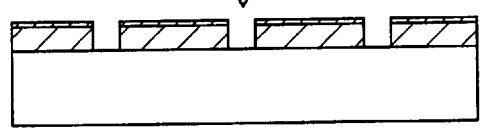
Figure 5F:
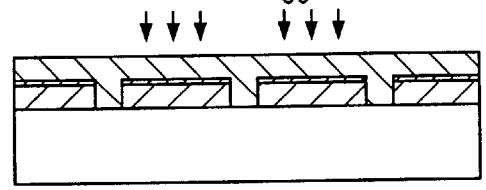
Figure 5G:
Figure 5H:
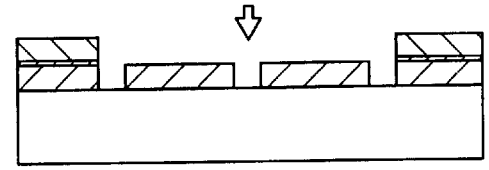
Figure 5I:
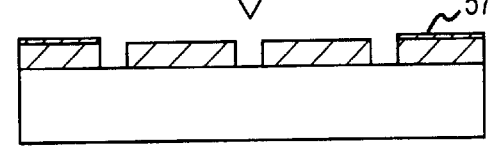

Limitations of PSM mask blanks, and methods which combine attenuation and phase-shifting functions into a single-film, are overcome by implementing multilayer structures which provide etch selectivity (e.g., by layer composition, etching process, and/or the use of etch stop layers), and also which provide greater flexibility in controlling optical transmission (e.g. T>5%) and phase-shift functions (e.g. $\phi=0°$, $90°$, $180°$ and $270°$) for various wavelengths of incident light. The desired optical transmission at a given wavelength may be achieved by adjusting optical properties and thickness of an attenuating layer. The desired phase-shift may be obtained by additionally depositing an optically transmissive layer of an appropriate thickness. The resulting multilayer PSM structure can be tuned for optical transmission and phase-shift performance at specific wavelengths to an extent not available utilizing a single layer film.

Gray-scale electron beam lithography can further be employed in conjunction with the multilayered mask blank structure to exploit resist contrast. This approach may also be combined with dry processing methods exploiting etch selectivity afforded by the selection of appropriate film constituents for the mask blank structure. These improvements can lead to higher yield at a lower processing cost for the fabrication of PSMs. Various embodiments of the present invention are discussed in detail below.

Processing Techniques and Materials

Phase shift masks and methods in accordance with embodiments of the present invention utilize various material layers exhibiting specific physical characteristics, including optical properties, mechanical properties, and etch selectivity. Two particularly important materials utilized in PSM's in accordance with the present invention are diamond-like-carbon (DLC) and oxide.

Diamond-Like-Carbon

As described below, embodiments of methods and structures in accordance with the present invention employ DLC films for etch-stop and optical attenuation purposes.

In general, the term diamond-like-carbon describes a family of amorphous carbon materials whose properties resemble, but do not duplicate, the properties of diamond. Chemical bonding within DLC materials may be described as a random covalent network of $sp^2$-bonded "graphite" carbon structures interconnected by $sp^3$ "diamond-like" linkages, with no long-range crystalline order. DLC films may or may not contain substantial quantities of hydrogen.

DLC films have conventionally been employed for a variety of applications, including storage of data, and use as robust coatings for sunglasses and laser bar-code scanner windows. Conventional DLC films employed in these applications typically exhibit a high degree of hardness, with an associated physical stress of the film typically exceeding 2 GPa.

DLC films have also conventionally been employed in photomasking applications. However, DLC films utilized in photomask applications require a degree of microscale uniformity and smoothness not necessary for coatings for sunglasses or bar scanners. The physical hardness associated with the DLC films for coating sunglasses and bar scanners is generally not necessary.

Conventional DLC films for photomasking applications have been produced utilizing magnetron sputtering and plasma enhanced chemical vapor deposition (PECVD). However, the film defect counts on a microscopic scale for DLC films formed by these processes have been too high, and the density of these films too low, for precise photomasking applications.

Accordingly, DLC films employed in accordance with embodiments of the present invention are produced by ion-beam deposition techniques. One example of an ion-beam deposition technique for DLC is described in U.S. Pat. No. 5,508,368 incorporated by reference herein. DLC films formed by ion beam deposition exhibit defect levels superior to DLC films formed by magnetron sputtering or PECVD. DLC films used in certain embodiments of the present invention preferably exhibit no larger than 0.5 $\mu$m as measured by a PD 3000 inspection device manufactured by Horiba, Ltd. of Kyoto, Japan. One possible reason for the lower defect levels associated with ion beam deposition may be that the reduced operating pressures lower the potential for particulates and contamination of the ion-beam deposited DLC film.

The use of ion beam deposition to form DLC in accordance with embodiments of the present invention permits stress in the DLC film to be kept relatively low, below 1 GPa and preferably below 0.6 GPa. Stress in the DLC film can be measured utilizing an FSM 8800 apparatus manufactured by Frontier Semiconductor Inc. of San Jose, Calif. Careful monitoring and control over parameters of ion beam deposition such as beam energy, pressure, impurity concentration, and annealing temperature and duration may allow this low stress characteristic to be achieved.

Another characteristic of high quality DLC films employed in embodiments of the present invention is resiliency to chemistries typically employed to clean masks between use. Specifically, when exposed to a mask cleaning solution of 80% $H_2SO_4$/20% $H_2O_2$ at 70° C. for one hour, a DLC film preferably employed in embodiments of the present invention exhibits a tolerance change of 0.4% or less for both transmission and phase shifting properties. Percent tolerance change may be calculated as follows:

% tolerance change=$(T_0-T_1)/T_0 * 100$, where:
 $T_0$=initial value of transmission or phase shift
 $T_1$=transmission or phase shift value following exposure to cleaning chemistry.

Oxide Films

Oxides are another class of material whose structure and function is important to embodiments of the present invention. As described in detail below, oxide films may be employed in PSM's in accordance with the present invention in order to alter the phase of transmitted light. Oxide materials utilized in embodiments of the present invention include, but are not limited to, silicon dioxide ($SiO_2$), aluminum oxide ($Al_2O_3$), hafnium oxide ($HfO_2$), titanium oxide ($TiO_2$), zirconium oxide ($ZrO_2$), and/or tantalum oxide ($Ta_2O_5$).

As with the DLC films previously described, the oxide films should exhibit desirable uniformity and smoothness on a microscopic scale, and also exhibit desirable high transmission of incident light at desired wavelengths. Oxide films utilized in embodiments of the present invention should also adhere well to underlying (DLC) films. Oxide films employed in PSM structures and methods in accordance with embodiments of the present invention should also exhibit low stress and correspondingly low defect counts.

High quality oxide films may be deposited utilizing ion beam sputtering. One method employs a target of the desired oxide and a second ion beam to assist in the oxide deposition. A second method employs a target of silicon, hafnium, titanium, zirconium, aluminum, or tantalum, and a second beam of oxygen to oxidize the sputtered target material.

Multilayer Structure for PSM Blanks

The multilayer PSM mask approach of the present invention can result in several embodiments that can be utilized to produce AAPSMs, EAPSMs, or iPSMs. Described below are examples of possible embodiments for specific applications. The multilayer structure for selective etch may be varied depending on the particular application. The structures illustrated below are designed to exploit the gray-scale lithography and processing techniques described in the following section. However, conventional multiple lithography steps of the prior art can be applied to these structures. In this case, the structures would provide etch stops for improved PSM processing tolerance.

Multilayer Mask Blank Structure for Formation of AAPSM

Two multilayer embodiments of methods of the present invention for fabricating AAPSM's are described below. However, the present invention is not limited to these particular embodiments. Gray-scale or conventional lithography processes may be applied to mask blanks with the multilayer structures of the present invention on them to define the AAPSM features.

Figure 6:
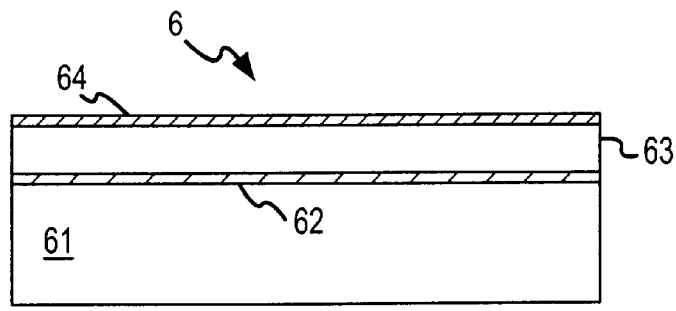
FIG. 6 shows a simplified cross-sectional view of one embodiment a mask blank structure for forming an AAPSM in accordance with the present invention.

FIG. 6 shows a simplified cross-sectional view of one embodiment of a mask blank structure for forming an AAPSM in accordance with the present invention. The multilayer mask blank structure of FIG. 6 includes a thin etch stop layer 62, phase-shift layer 63 and thin Cr layer 64 deposited on UV-grade substrate 61. Where the substrate 61 is quartz and the layer 64 is conductive Cr that minimizes charge build-up during electron beam writing and for defining the opaque patterns, thin etch stop layer 62, e.g. diamond-like-carbon (DLC) may act as an etch stop during removal of phase-shift layer 63 (e.g. $SiO_2$, $HfO_2$, etc.) that can be selectively etched against the etch stop layer. As described above, the DLC of etch stop layer 62 is preferably formed by ion-beam deposition techniques and exhibits a stress of 1 GPa or less, and preferably a stress of 0.6 GPa or less.

In contrast with mask blank structures for EAPSM's (see below), etch stop layer 62 of the AAPSM mask blank is typically much thinner than phase shift layer 63. For example, a DLC etch stop layer is typically less than 50 Å thick. However, the thickness of the phase shift layer approximately equals the wavelength of the incident light to yield a 180° shift in phase, which in deep UV lithography applications is in the range of hundreds of nanometers.

Following the lithography steps, the Cr layer can be removed using a dry or wet etching step to expose the underlying phase-shifting layer 63. The exposed phase-shifting layer 63 can be selectively removed (e.g. using $CHF_3$ plasma etching for a phase shift layer of $SiO_2$), to reach etch stop layer 62. Properly selected in light of the etching chemistry employed, the composition of the etch stop layer 62 (e.g. DLC) protects the substrate from etching. For example, the etch rate of DLC under $CHF_3$ plasma is minimal compared to the etch rate of a phase-shifting layer 63 comprising $SiO_2$. Utilizing a multilayer mask blank in the manner described, phase-shifting attributes for a AAPSM structure can be accurately and uniformly defined without requiring in-situ monitoring of etch depth.

Figure 7:
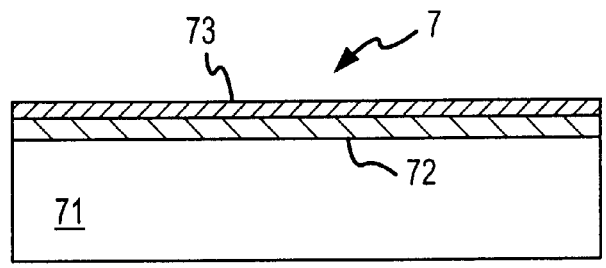
FIG. 7 shows a simplified cross-sectional view of another embodiment of a mask blank structure for forming an AAPSM in accordance with the present invention.

FIG. 7 shows a simplified cross-sectional view of a second embodiment of a multilayer mask blank structure for fabrication of an AAPSM in accordance with the present invention. Phase-shift layer 72 (e.g. $SiO_2$) is deposited on a substrate 71 (e.g. fluorinated glass or $CaF_2$) which allows selective etching of layer 72. The top surface is coated with an opaque optical layer (i.e. Cr) 73. If the substrate 71 is fluorinated glass or $CaF_2$, etch selectivity between a phase-shifting layer 72 such as $SiO_2$ and the substrate may be sufficiently high to avoid the need for a separate DLC etch stop layer as shown in FIG. 6.

Multilayer Mask Blank Structure for Formation of EAPSM

Figure 8:
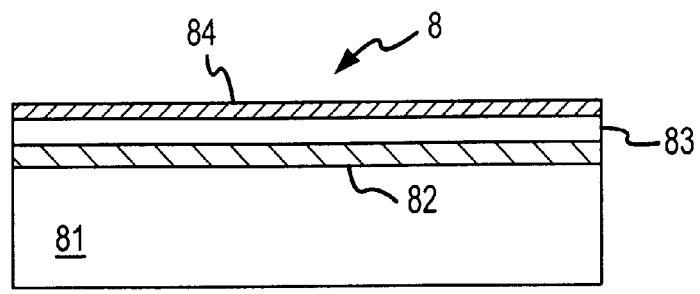
FIG. 8 shows a simplified cross-sectional view of one embodiment of a mask blank structure for forming an EAPSM structure in accordance with the present invention.

Gray-scale or conventional lithography techniques may be applied to mask blanks having the multilayer structures of the present invention to define EAPSM features. FIG. 8 shows a simplified cross-sectional view of one embodiment of a mask blank structure for forming an EAPSM in accordance with the present invention. The mask blank structure shown in FIG. 8 comprises tuned absorption layer 82, phase-compensation layer 83 and Cr layer 84 formed on top of UV-grade transmissive substrate 81.

In a preferred embodiment of the present invention, attenuation layer 82 is composed of a material (such as DLC) that also exhibits partial phase-shifting properties and is employed in conjunction with phase compensation layer 83 (e.g. $SiO_2$) that produces the desired amount of total phase-shift (e.g. 180°), and a Cr layer 84 to minimize charge build-up during electron beam writing and for defining opaque borders.

For EAPSMs, features preferably attenuate optical transmission between 5 and 25%, and shift the phase of the incident wave front by 180°. This dual function is difficult to achieve using a single layer, especially for lithography at wavelengths of 248 nm or less.

However, embodiments of the present invention overcome this limitation by partially separating the two optical functions by adjusting the thickness $d_1$ of the absorbing layer 82 to achieve desired transmission, and by compensating for the remaining phase difference by adjusting the thickness of phase compensation layer 83.

The desired transmission can be achieved by determining the thickness of the absorbing layer according to the relation, $$T(\lambda)=T_O \exp[-4\pi k_1(\lambda)d_1/\lambda],\text{ where:}$$

$T_O$=initial value of transmission $T(\lambda)$=desired transmission;

$d_1$=thickness of the absorbing layer; and $k_1(\lambda)$=complex part of the refractive index of the absorbing layer material at the operation wavelength $\lambda$.

The desired 180° phase delay of $\Delta\phi_{total}$ through the multilayer structure can be achieved by applying the following the relation, $$\Delta\phi_{total}=\Delta\phi_1+\Delta\phi_2=[(n_1(\lambda)-1)d_1+(n_2(\lambda)-1)d_2]2\pi/\lambda, \text{ where:}$$

$\Delta\phi_{total}$=total phase delay;

$n_1(\lambda)$=refractive index of absorbing layer at wavelength $\lambda$;

$n_2(\lambda)$=refractive index of phase correcting layer at wavelength $\lambda$;

$d_1$=thicknesses of the absorbing layer; and $d_2$=the thicknesses of the phase correcting layer.

The material for the substrate 81 can be chosen to allow selective etch against the attenuating layer (e.g. quartz for DLC).

For some applications (e.g. extreme ultraviolet (EUV) lithography), it may be difficult to obtain material completely transparent to incident wavelength because of a small amount of inherent absorption of the phase compensation layer in its preferred stoichiometric form. In such an embodiment, thickness of the phase correcting layer could be determined by following the general form given above, with absorption caused by the phase compensation layer treated as perturbation of absorption induced by the attenuating layer.

In EAPSM mask blanks, the major function of the attenuation layer is to provide control over light transmission, while the role of the oxide phase compensation layer is to provide the balance of the required 180° phase shift. For this reason, in EAPSM blanks the DLC and oxide films are typically approximately equal in thickness on order of hundreds of angstroms, with $d_1<d_2$. Actual film thicknesses resulting in desirable overall transmission and phase characteristics of the multilayer mask structure may be precisely calculated using software programs. One example of such a program is the Film Wizard software package available from Scientific Computing International of Carlsbad, Calif.

Multilayer Mask Blank Structure for Formation of iPSM

Figure 16:
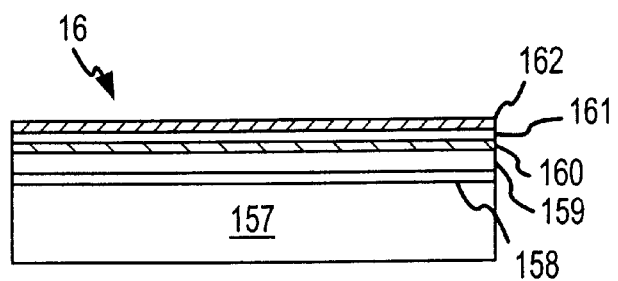
FIG. 16 shows a simplified cross-sectional view of one embodiment of a multilayer mask blank structure for forming an iPSM structure in accordance with the present invention.

In certain applications, it may be desirable to incorporate AAPSM, EAPSM, OPC and/or other RET features on a single, integrated phase shift mask (iPSM). Accordingly, FIG. 16 shows a simplified cross-sectional view of an embodiment of a mask blank structure for forming an iPSM structure in accordance with the present invention.

Multilayer mask blank 16 comprises a UV transparent substrate 157 coated with a multilayer of films comprising thin layer of fluorine plasma-resistant material 158 (e.g. DLC), π-phase-shifting layer 159 (e.g. $SiO_2$), attenuation layer 160 (e.g. DLC), chlorine-based plasma or wet-etch resistant layer 161 (e.g. $SiO_2$), and chrome layer 162. The embodiment of a mask blank structure shown in FIG. 16 thus implements material layers exhibiting high etch selectivity against underlying layers with appropriate dry or wet etching chemistry. In addition, as described in detail below in conjunction with FIGS. 14A–14H, application of gray scale lithography techniques to mask blank 16 can result in formation of an iPSM mask exhibiting both AAPSM and EAPSM characteristics.

For iPSM blanks, oxide and DLC films 160 and 161 respectively, positioned immediately beneath the opaque chrome layer are on the order of hundreds of angstroms in thickness. Oxide film 159 overlying the substrate is about one wavelength in thickness, while the DLC etch stop film 158 overlying the substrate is 50 angstroms or less in thickness.

Conventional Processing of Multilayer Mask Blank Structure

The structure of the multilayer mask blank for selective etch may be varied depending on the particular application. While the multilayer mask blank may be employed in conjunction with gray scale processing as described in detail below, conventional multiple lithography steps can also be applied to these mask blank structures.

FIGS. 15A–15I show a cross sectional view of steps for forming an EAPSM utilizing a multilayer mask blank in conjunction with conventional lithography steps. FIG. 15A shows a cross-sectional view of a multilayer mask blank 18 comprising tuned absorption layer 188 of DLC formed over optically transparent quartz substrate 181. Phase compensating layer 182 is in turn formed over tuned absorption layer 188. Optically opaque chromium layer 183 is present on top of phase compensating layer 182, and electron-beam sensitive photoresist 184 is formed over opaque chromium layer 183.

In FIG. 15B, the electron beam sensitive resist layer 184 is patterned utilizing conventional exposure and development lithography techniques 185. In FIG. 15C, regions of chromium layer 183 exposed by patterned resist 184 are subjected to wet etching selective to underlying silicon dioxide layer 182.

In FIG. 15D, underlying portions of silicon dioxide phase compensating layer 182 exposed by the prior etching step are removed by fluorine-based plasma etching selective to underlying DLC layer 188. In FIG. 15E, exposed DLC layer 188 and remaining electron beam resist 184 are removed by exposure to $O_2$ plasma selective to the underlying quartz substrate 181.

In FIG. 15F, a second resist layer 189 is formed over patterned chromium layer 183 and exposed underlying quartz substrate 181. Second resist layer 189 may be either an optical-beam sensitive resist or an electron-beam sensitive resist.

In FIG. 15G, second resist layer 189 is patterned using conventional exposure and development lithography techniques 186 to develop border patterns. In FIG. 15H, regions exposed by second patterned resist layer 189 are exposed to wet etching to remove chromium layer 183. Finally, in FIG. 15I remaining portions of the second resist layer are removed, with chromium border patterns 187 and the quartz substrate serving as etch stops.

In the method just described in conjunction with FIGS. 15A–I, the presence of the DLC and $SiO_2$ layers in the multilayer mask blank provides for improved etch tolerance and transmittance control, without affecting the optical properties of the PSM formed thereby. Moreover, while FIGS. 15A–I illustrate formation of an EAPSM structure utilizing conventional processing of a multilayer mask blank structure in accordance with one embodiment of the present invention, an AAPSM structure could also be formed by conventional processing of a multilayer mask blank structure.

Figure 17A:
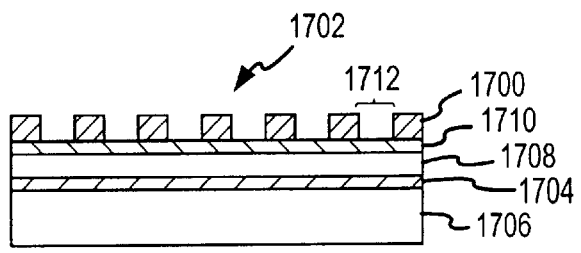
FIGS. 17A–17H show a cross-sectional view of steps for forming an AAPSM utilizing a multilayer mask blank in conjunction with conventional lithography steps.

Accordingly, FIGS. 17A–17H show a cross sectional view of steps for forming an AAPSM utilizing a multilayer mask blank in conjunction with conventional lithography steps. In FIG. 17A, first resist layer 1700 is patterned over mask blank structure 1702 to reveal unmasked regions 1712. Mask blank structure 1702 comprises DLC etch stop layer 1704 overlying optically transparent substrate 1706. Oxide layer 1708 overlies DLC etch stop layer 1704, and chrome optically opaque layer 1710 overlies oxide layer 1708.

Figure 17B:
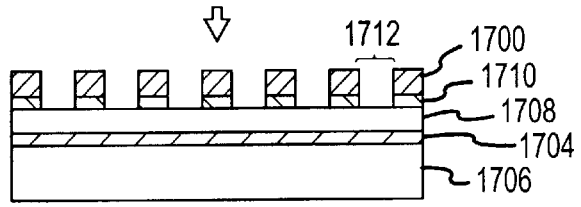
Figure 17C:
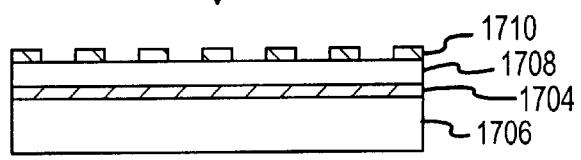

In FIG. 17B, chrome optically opaque layer 1710 is removed selective to underlying oxide layer 1708 in first unmasked regions 1712 by exposure to chlorine-based etching chemistry. In FIG. 17C, first patterned resist layer 1700 is removed.

Figure 17D:
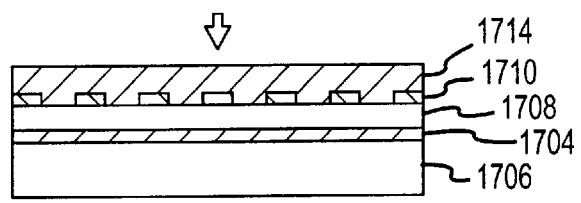
Figure 17E:
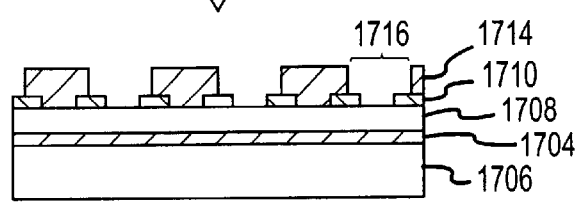
Figure 17F:
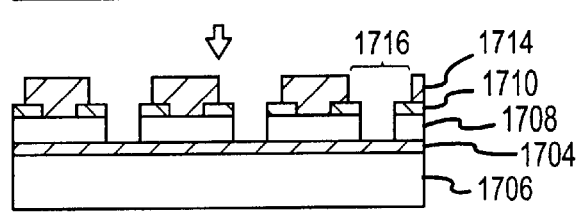

In FIG. 17D, a second resist layer 1714 is applied over chrome features 1710 and exposed oxide layer 1708. In FIG. 17E, second resist layer 1714 is patterned to expose alternating second unmasked regions 1716. In FIG. 17F, oxide layer 1708 exposed in second unmasked regions 1716 is removed selective to underlying DLC etch stop layer 1704 by exposure to fluorine-based etching chemistry.

Figure 17G:
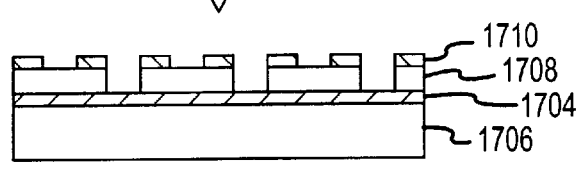
Figure 17H:
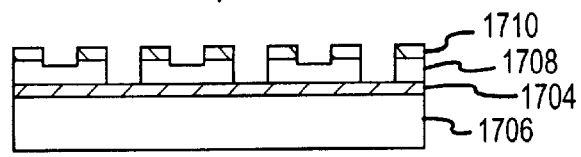

In FIG. 17G, second patterned resist 1714 is removed. In FIG. 17H, wet etchant is applied to AAPSM mask blank structure to slightly undercut patterned chrome layer 1710.

Figure 18A:
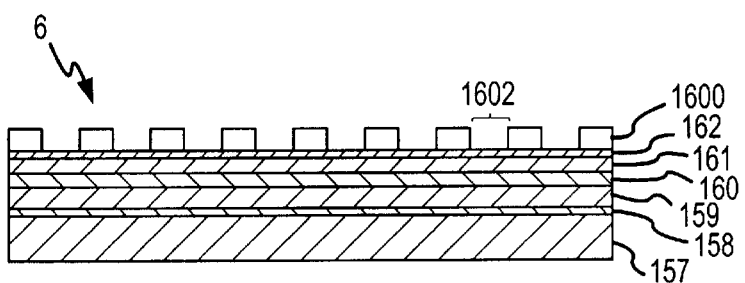
FIGS. 18A–18G show a cross sectional view of steps for forming an iPSM utilizing a multilayer mask blank in conjunction with conventional multiple lithography steps.

FIGS. 18A–18G show a cross-sectional view of steps for forming an iPSM utilizing a multilayer mask blank in conjunction with conventional multiple lithography steps. In FIG. 18A, first resist layer 1600 is patterned over multilayer mask blank structure 16 of FIG. 16.

Figure 18B:
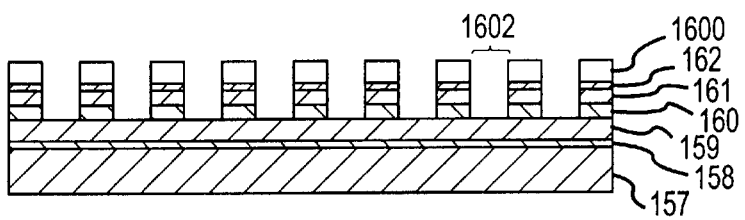

In FIG. 18B, mask blank material underlying unmasked region 1602 is removed. Specifically, optically opaque chrome layer 162 is removed by chlorine based dry etchant to stop on underlying oxide layer 161. Oxide layer 161 in unmasked region 1602 is then removed with a fluorine-based etchant to stop on DLC etch stop layer 160. Finally, DLC etch stop layer 160 in unmasked region 1602 is removed by dry etching with oxygen.

Figure 18C:
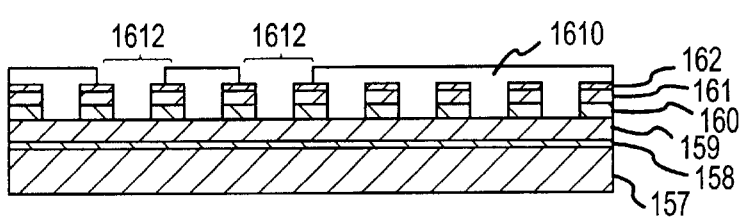

FIG. 18C shows the next step in the process, wherein the first resist layer is removed and second resist layer 1610 is patterned.

Figure 18D:
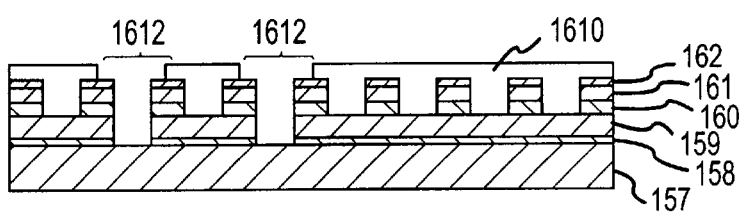

In FIG. 18D, second oxide layer 159 in unmasked region 1612 is removed by etching with a fluorine-based dry etchant, with second DLC layer 158 serving as an etch stop during this process. Second DLC layer 158 in unmasked region 1612 is then removed by oxygen dry etching, with substrate 157 serving as the etch stop.

Figure 18E:
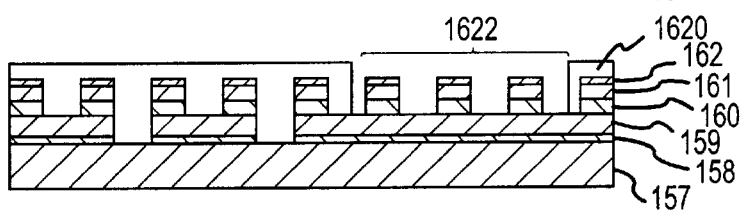

FIG. 18E shows the next step, wherein second resist layer 1610 and second DLC layer 158 in unmasked region 1612 are removed by a second exposure to oxygen dry etching, with substrate 157 again serving as the etch stop. Third resist layer 1620 is then patterned.

Figure 18F:
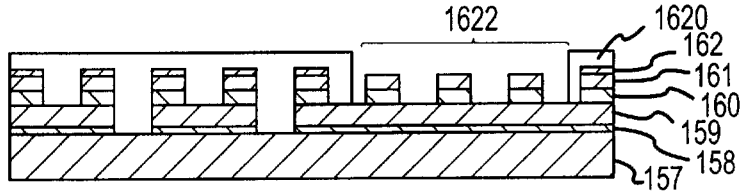
Figure 18G:
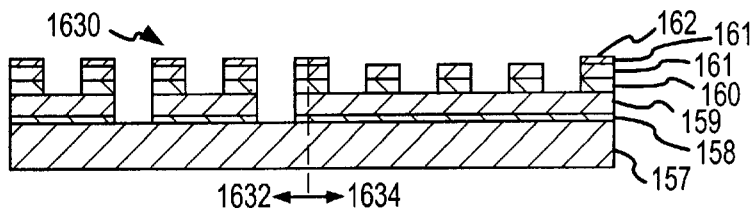

In FIG. 18F, optically opaque chrome layer 162 in unmasked regions 1622 is removed by exposure to chlorine-based dry etchant. In FIG. 18G third resist layer 1620 is removed by exposure to oxygen dry etchant to reveal iPSM features 1630 featuring AAPSM features 1632 and EAPSM features 1634.

Gray-Scale Processing

Gray-scale (GS) processing in accordance with embodiments of the present invention involves multi-level writing and subsequent etching steps that can significantly enhance process yield and reduce the cost of fabricating PSMs. The GS processing of the present invention can be performed utilizing either electron-beam sensitive resist or optical-beam sensitive photoresist. The GS processing of the present invention can be applied to both traditional mask blanks and to multilayered mask blanks in accordance with the present invention as previously described.

Gray-Scale Processing of Conventional PSM Mask Blanks

FIGS. 9A–9G show simplified cross-sectional views of processing steps of gray-scale lithography in accordance with one embodiment of the present invention leading to formation of AAPSMs. Gray-scale lithography and processing in accordance with one embodiment of the present invention is applied to electron-beam resist 93 coated on Cr-coated 92 substrate 91 for the fabrication of AAPSMs. Electron beam lithography with different dosages and combined wet/dry etching steps can be applied to achieve the desired AAPSM features in fewer processing steps and for lower cost and higher yield.

Figure 9A:
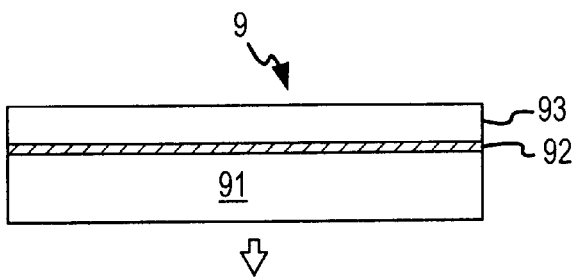
FIGS. 9A–9G shows simplified cross-sectional views of processing steps of gray-scale lithography in accordance with one embodiment of the present invention leading to formation of AAPSMs.

In a simple embodiment, GS processing can be applied to traditional mask blanks as illustrated in FIGS. 9A–9G for Cr-coated quartz plates. FIG. 9A shows a conventional mask blank 9 comprising electron-beam resist 93 coated on Cr-coated 92 substrate 91.

Figure 9B:
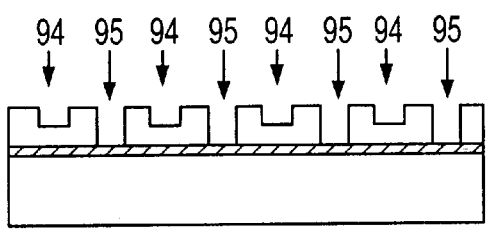

In FIG. 9B, two thicknesses of electron-beam sensitive resist 93 such as PBS or ZEP-7000 are defined by applying different electron beam dosages to achieve features with different heights, represented by 94 and 95, without breaking the vacuum to realize different levels after development. Not having to break the vacuum should increase yield, reduce e-beam time, and thereby lower device manufacturing cost.

Once features 94 and 95 are created, a combination of wet and dry etching steps can then be applied to define the phase-shifting structures as illustrated in FIGS. 9C–9G as follows.

Figure 9C:
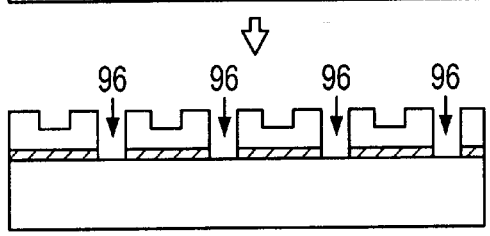
Figure 9D:
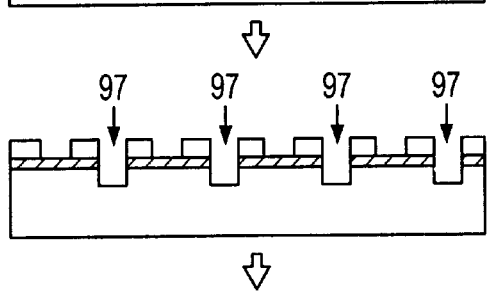
Figure 9E:
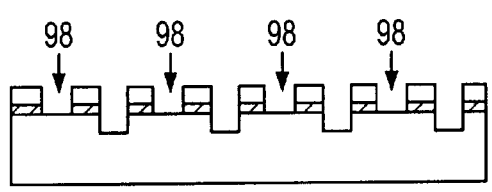
Figure 9F:
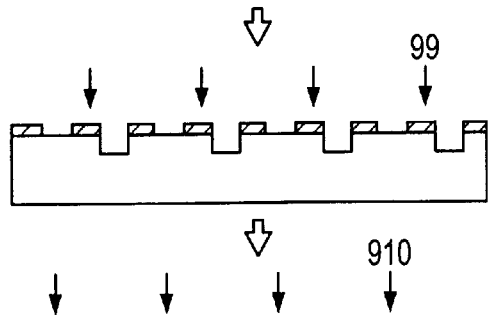
Figure 9G:

In FIG. 9C, wet or dry Cr etching process 96 is applied to portions 92a of Cr layer 92 exposed by resist features 94 and 95. In FIG. 9D, exposed quartz substrate 91 is exposed to dry etching process 97 comprising fluorine based gas. A trace amount of oxygen to slowly thin the remaining resist is then applied with optical/physical monitoring to stop the etch when appropriate phase depth is reached.

As shown in FIG. 9D, once the substrate is etched to the desired depth, gas is switched to pure oxygen with other inactive gas (e.g. He, $N_2$, Ar, etc.) to thin the resist gradually until the Cr layer is reached for the second level. Next, in FIG. 9E the Cr is etched away through a wet or dry etching step 98, and then in FIG. 9F the remaining resist is completely etched away using $O_2$ plasma 99. Finally, in FIG. 9G a blanket isotropic etch 100 is then applied to undercut the remaining Cr slightly to avoid edge effects.

When the etching steps (including removal of Cr) to be applied are dry etches, fabrication steps following the e-beam lithography can be applied without breaking the vacuum, with appropriate in-situ optical and chemical monitoring. Specifically, the Cr can be etched using chlorine-based gas plasma such as HCl (96) and monitoring the chemical composition until Cr-complex is no longer detected. The processing gas can then be switched over to a fluorine-based gas such as $CHF_3$ with a trace amount of oxygen to etch the quartz substrate while monitoring the etch depth optically until half-wave ($\lambda/2$) depth is reached. A small amount of $O_2$ may be added to the plasma to simultaneously thin the resist down to expose the Cr layer for the complimentary phase-shifting features, although this step may be applied sequentially with $O_2$ plasma alone. The complementary features are then etched from the Cr, the remaining resist is removed using $O_2$ plasma, and an isotropic etch is applied to undercut the Cr slightly using either a parallel plate plasma etch or wet etching.

Figure 10A:
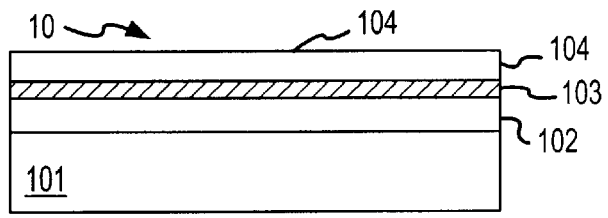
FIGS. 10A–10G show simplified cross-sectional views of processing steps of gray-scale lithography in accordance with another embodiment of the present invention leading to formation of EAPSMs.

FIGS. 10A–10G show simplified cross-sectional views of GS processing steps performed upon a conventional mask blank leading to formation of EAPSMs accordance with another embodiment of the present invention. FIG. 10A shows $MoSi_xO_yN_z$-coated mask blank 10 comprising quartz substrate 101 coated with $MoSi_xO_yN_z$ 102, Cr 103, and electron-beam resist 104.

Figure 10B:
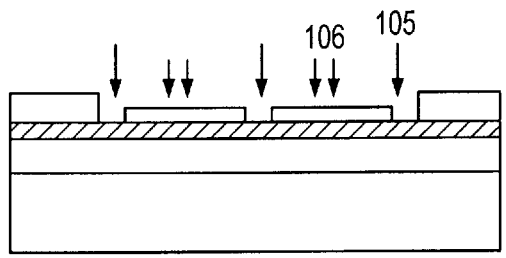
Figure 10C:
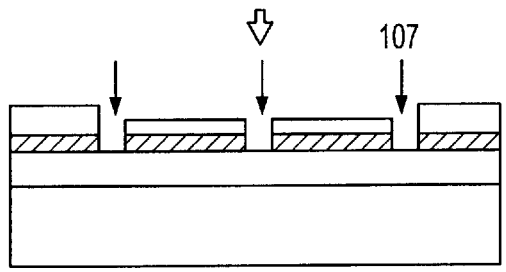
Figure 10D:
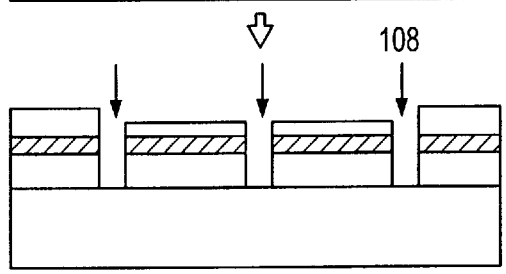

FIG. 10B shows application of electron beam writing to mask blank 10 with different electron dosages 105 and 106 to achieve features with different heights as shown. FIG. 10C shows application of wet or dry Cr etching process 107 to Cr layer exposed by the resist features, opening the windows to expose the underlying $MoSi_xO_yN_z$ layer. FIG. 10D shows application of a selective dry etching process 108 is then applied to etch exposed portions of the $MoSi_xO_yN_z$ layer to stop on the substrate.

Figure 10E:
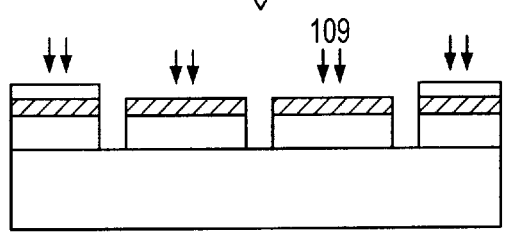
Figure 10F:
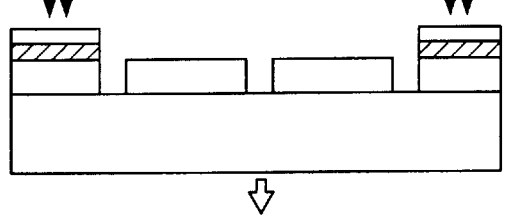
Figure 10G:
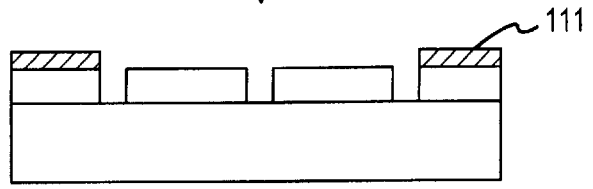

FIG. 10E shows that the etching gas is then switched to pure oxygen with other inactive gas (e.g. He, $N_2$, Ar, etc.) to thin the resist gradually (109) until the Cr layer is reached for the second level. FIG. 10F shows that the Cr is next etched away through a wet or dry etching step 110, and then in FIG. 10G the remaining resist is completely etched away using $O_2$ plasma 111 to expose the opaque Cr border.

As shown above, electron beam lithography with different dosages and combined wet/dry etching steps can be applied to achieve desired EAPSM features in fewer processing steps and for lower cost and with higher yield.

Gray-Scale Processing of Multilayer PSM Mask Blanks

When GS processing as described in the previous section is applied to multilayered mask blanks in accordance with embodiments of the present invention, a further increase in process yield and throughput may be realized due to the presence of etch stop layers. By selecting appropriate materials for the multilayer structure having substantial etch selectivity against the underlying layer or the substrate, a large process window can be created for improved process tolerance. This is illustrated in FIGS. 11 and 12 for formation of AAPSM and EAPSM structures, respectively.

FIGS. 11A–11G show simplified cross-sectional views of processing steps of combined application of multilayer structure and gray-scale lithography in accordance with one embodiment of the present invention. Combined application of multilayer structure and gray-scale lithography of the present invention is shown for fabrication of AAPSM. Electron beam lithography with different dosages and combined wet/dry etching steps can be applied to achieve the desired AAPSM with large process windows due to the presence of etch stops for lower cost and higher yield.

For the process for forming an AAPSM as shown in FIGS. 11A–11G, in FIG. 11A UV transparent substrate 112 is coated with a thin etch stop layer (e.g. DLC) 113, phase-shifting layer (e.g. $SiO_2$, $HfO_2$, etc.) 114, Cr 115, and electron-beam resist 116.

In FIG. 11B, electron beam writing is applied to the mask blank 11 with different electron dosages 117 and 118 to achieve features with different heights as shown. In FIG. 11C, wet or dry Cr etching process 119 is then applied to open windows exposing the underlying phase-shift layer 114.

In FIG. 11D, selective dry etching process 120 is next applied to etch phase shift layer 114. This etch step halts at the interface between layer 114 and underlying etch stop layer 113. The etching gas is then switched to pure oxygen with other inactive gas (e.g. He, $N_2$, Ar, etc.) to thin the resist and etch stop layer 113 gradually (illustrated as process step 121) until the Cr layer is reached.

In FIG. 11E, the Cr is then etched away through a wet or dry etching step 122. Where a dry etch is applied during this step, the plasma chemistry is chosen so that phase shifting layer (typically $SiO_2$) 114 can serve as an etch stop. The remaining resist and the stop layer 113 are completely etched away using $O_2$- Since the substrate is not etched by $O_2$ plasma, the etch process is self-stopping.

In FIG. 11F, remaining resist is exposed to $O_2$ plasma 123 and is removed. For light transmitted through the resulting AAPSM structure of FIG. 11G containing a phase shift layer, the light is shifted in phase 180° with little or no change in amplitude.

FIGS. 12A–12G show simplified cross-sectional views of processing steps of combined application of multilayer structure and gray-scale lithography in accordance with an alternative embodiment of the present invention. In combined application of multilayer structure and gray-scale lithography for fabrication of EAPSM, electron beam lithography with different dosages and combined we/dry etching steps can be applied to achieve the desired EAPSM with large process windows due to the presence of etch stops for lower cost and higher yield.

Figure 12A:
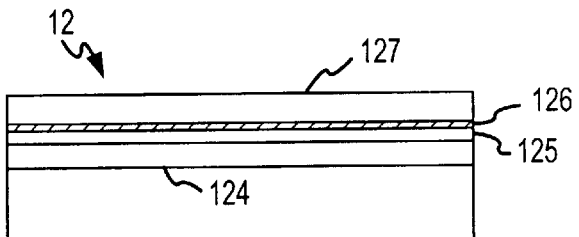
FIGS. 12A–12G show simplified cross-sectional views of processing steps of combined application of multilayer structure and gray-scale lithography approaches to form an EAPSM in accordance with another alternative embodiment of the present invention.
Figure 12B:
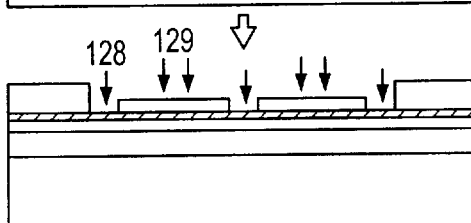
Figure 12C:
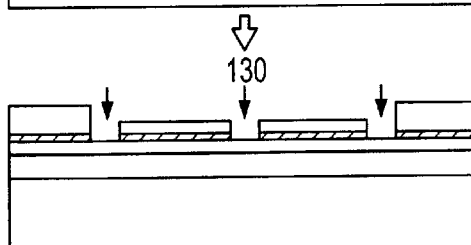

For the process of forming the EAPSM as shown in FIGS. 12A–12G, in FIG. 12A a UV transparent substrate is coated with an attenuation layer (e.g. DLC) 124, phase correcting layer (e.g. $SiO_2$) 125, Cr layer 126, and electron-beam resist layer 127. In FIG. 12B electron beam writing is applied to the mask blank 12 with different electron dosages 128 and 129 to achieve features with different heights as shown. In FIG. 12C wet or dry Cr etching process 130 is then applied to remove exposed Cr and open windows to expose the underlying phase correcting layer 125.

Figure 12D:
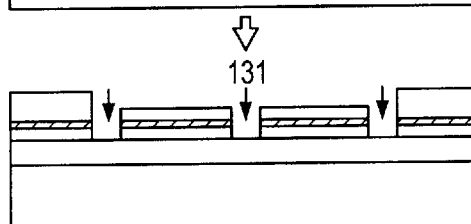
Figure 12E:
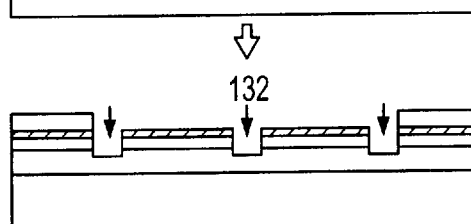

In FIG. 12D a selective dry etching process 131 is then applied to etch phase correcting layer 125 to stop on attenuation layer 124. In FIG. 12E, the etching gas is next switched to pure oxygen with other inactive gas (e.g. He, $N_2$, Ar, etc.) to thin the resist and the attenuation layer gradually (illustrated as process step 132) until the Cr layer is reached.

Figure 12F:
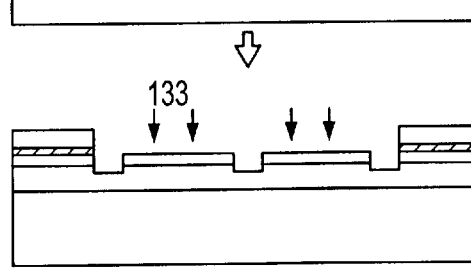
Figure 12G:
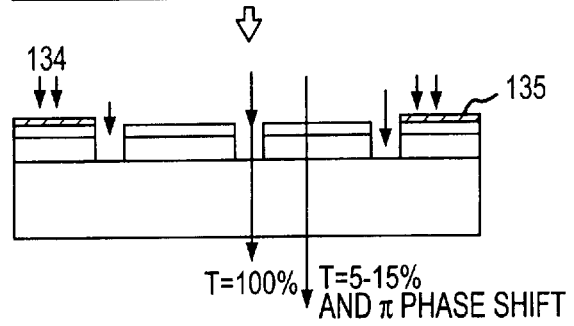

In FIG. 12F the Cr is then etched away through a wet or dry etching step 133. Here, plasma chemistry is chosen so that phase correcting layer (typically $SiO_2$) 124 can act as etch stop. In FIG. 12G the remaining resist 126 and the attenuation layer 124 are etched away using $O_2$ plasma 134 to define the un-shifted openings and to expose the opaque Cr border 135. Since the substrate is not etched by $O_2$ plasma, the process is self-stopping.

When all etching steps (including the Cr etches) to be applied are dry etches, all of the fabrication steps following the e-beam lithography can be applied without breaking the vacuum, with appropriate in-situ optical and chemical monitoring for both AAPSM and EAPSM fabrication.

Integrated Phase-Shift Mask (iPSM)

In addition to the benefits already discussed, GS processing performed upon multilayered mask blanks in accordance with the present invention may be applied to realize an iPSM incorporating AAPSM, EAPSM, OPC and/or other RET features on a single mask. This is illustrated in FIGS. 13A–J and 14A–H.

FIGS. 13A–13J show simplified cross-sectional views of processing steps of combined application of multilayer structure and gray-scale lithography in accordance with another alternative embodiment of the present invention.

FIGS. 13A–13J show combined application of multilayer structure and gray-scale lithography of the present invention for fabrication of an iPSM with various RET features such as AAPSM, EAPSM, OPC, etc.

In the embodiment of the present invention depicted in FIG. 13, multilayer mask blank 13 comprises UV transparent substrate 136 coated with an attenuation layer (e.g. DLC) 137, phase correcting layer (e.g. $SiO_2$) 138, Cr layer 139, and electron-beam resist 140. Electron beam writing is applied to mask blank 13 with different electron dosages 141A, 141B and 141C to achieve features with different heights as shown.

Figure 13A:
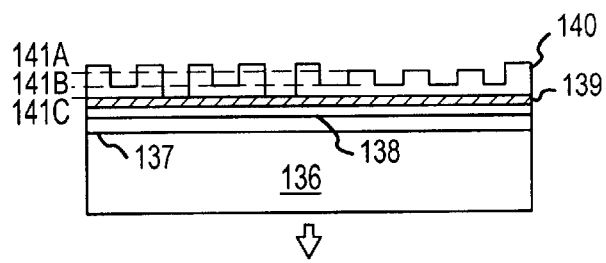
FIGS. 13A–13J show simplified cross-sectional views of processing steps of combined application of multilayer structure and gray-scale lithography to form an iPSM in accordance with another alternative embodiment of the present invention.
Figure 13F:
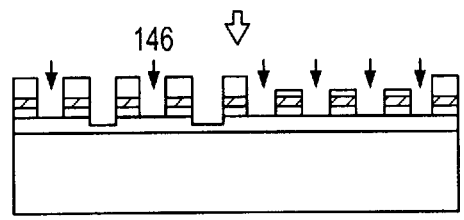
Figure 13B:
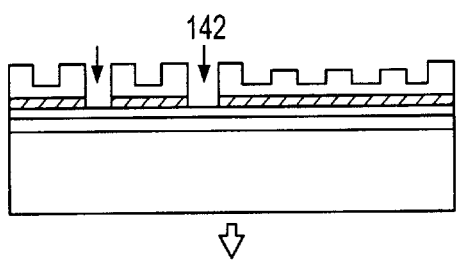

In FIG. 13B, wet or dry Cr etching process 142 is applied to remove Cr underlying regions exposed by the resist, thereby opening windows to expose the phase correcting layer 138. In FIG. 13C a selective dry etching process 143 is next applied to etch layer 138, stopping the etch at the interface between layer 138 and the attenuation layer 137.

Figure 13G:
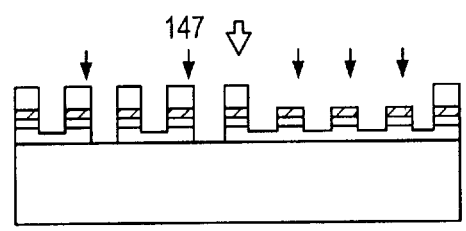
Figure 13C:
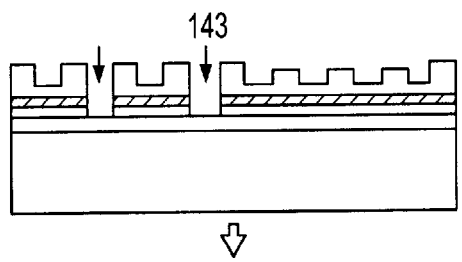
Figure 13H:
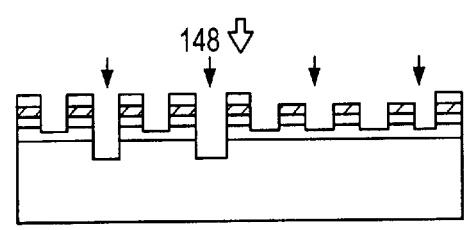
Figure 13D:
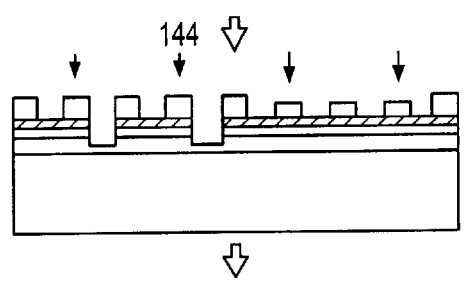
Figure 13I:
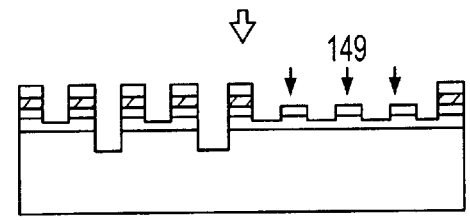
Figure 13E:
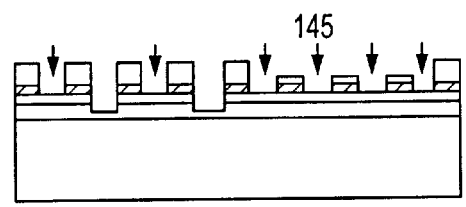

As shown in FIG. 13D, etching gas may then be switched to pure oxygen with other inactive gas (e.g. He, $N_2$, Ar, etc.) to thin the resist and the attenuation layer gradually (illustrated as process step 144) until the Cr layer is reached. In FIG. 13E, exposed Cr is then etched away through a wet or dry etching step 145. Here, plasma chemistry is chosen so that phase correcting layer 138 (typically $SiO_2$) can act as an etch stop.

In FIG. 13E, dry etch chemistry is switched fluorine based gas to selectively etch away the phase correcting layer (process 146) to the etch stop layer (i.e, the attenuation layer 137). In FIG. 13F, etching gas is then switched again to pure oxygen with other inactive gas (e.g. He, $N_2$, Ar, etc.) to thin the resist and the attenuation layer gradually (illustrated as process step 147) until the substrate on AAPSM feature and Cr layer on EAPSM features is reached.

As shown in FIG. 13G, dry etch chemistry is then switched fluorine based gas to etch the substrate to a 180° phase depth (process step 148) for AAPSM features. In FIG. 13I Cr layer is then etched away through a wet or dry etching step 149. For dry Cr etching, plasma chemistry is chosen so that phase correcting layer (typically $SiO_2$) 138 can act as etch stop. The remaining resist and the attenuation layer 137 are etched using $O_2$ plasma 149 to define the un-shifted openings and to expose the opaque Cr border 150. Since the substrate is not etched by $O_2$ plasma, the process is self-stopping.

Figure 13J:
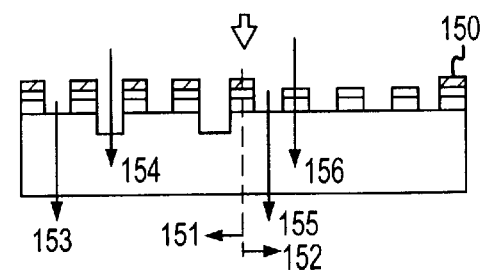

As shown in FIG. 13J, the illustrated process results in AAPSM features 151 with near 100% transmitting zero-shift 153 and π-shift 154 features. This illustrated process also results in EAPSM features 152 with un-attenuated (approx. 100%) transmitting 155 and attenuated, π-phase-shifted features 156.

FIGS. 14A–14F show simplified cross-sectional views of processing steps of combined application of a multilayer structure with etch stops and gray-scale lithography in accordance with yet another alternative embodiment of the present invention. Combined application of a multilayer structure with etch stops and gray-scale lithography of the present invention is utilized for fabricating an iPSM with various RET features such as AAPSM, EAPSM, OPC, etc.

Figure 14A:
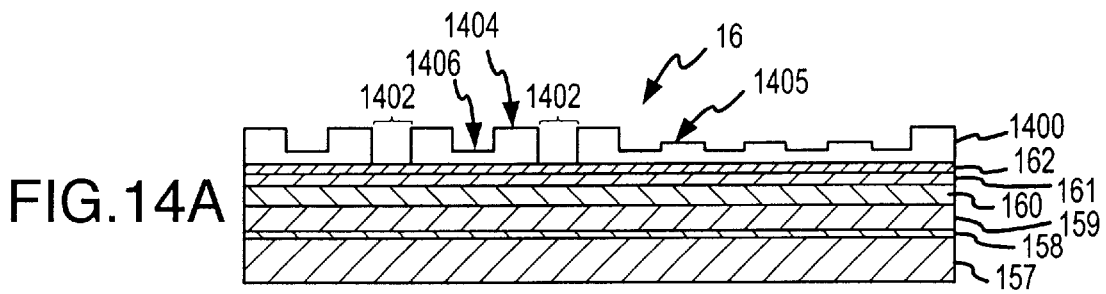
FIGS. 14A–14F show simplified cross-sectional view of processing steps of combined application of multilayer structure with etch stops and gray-scale lithography to form an iPSM in accordance with another alternative embodiment of the present invention.

As depicted in FIG. 14A, multilayer mask blank 16 previously described in FIG. 16 is coated with a pattern of electron-beam resist 1400. Although multilayer mask blank structure 16 is more complex compared to the embodiment previously described in FIGS. 13A–13J, this mask blank embodiment implements material layers exhibiting high etch selectivity against underlying layers with the appropriate dry or wet etching chemistry.

As with the previous process illustrated in FIGS. 13A–J, in FIG. 14A electron beam writing is first applied to the mask blank with different electron dosages to achieve first patterned resist layer 1400 exhibiting highest raised feature 1404, intermediate feature 1405, and lowest feature 1406. First unmasked region 1402 is also exposed during this step.

Figure 14B:
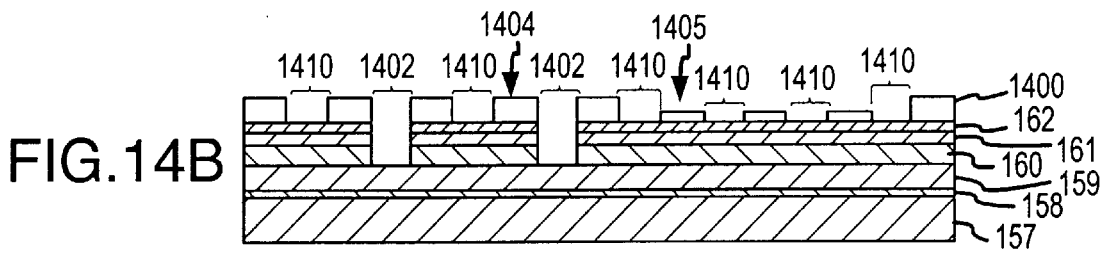

In FIG. 14B, a sequence of etching steps is applied to mask blank material underlying first unmasked region 1402. Specifically, optically opaque chrome layer 162 is removed by chlorine-based dry etchant to stop on underlying first oxide layer 161. First oxide layer 161 in unmasked region 1402 is then removed with a fluorine-based etchant to stop on DLC etch stop layer 160. Finally, DLC etch stop layer 160 in unmasked region 1402 is removed by dry etching with oxygen, with lower feature 1406 of first resist layer 1400 removed during this step to create second unmasked region 1410. Etching during this step is halted when residual gas analysis (RGA) indicates that removal of lower resist feature 1406 is complete, and etching of underlying opaque chrome layer 162 has begun.

Figure 14C:
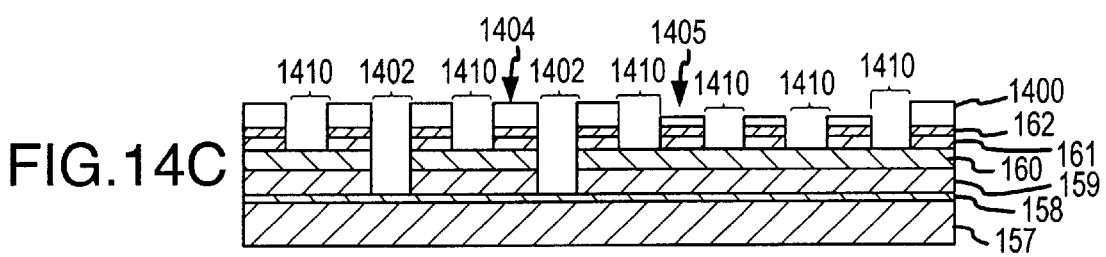

In FIG. 14C, optically opaque chrome layer 162 underlying second unmasked region 1410 is removed by exposure to chlorine-based etchant, with underlying first oxide layer 161 serving as an etch stop. Underlying first oxide layer 161 is then removed selective to first DLC etch stop layer 160 by exposure to fluorine-based etching chemistry. At the same time, second oxide layer 159 is removed in first unmasked region 1402 relative to underlying second DLC etch stop layer 158.

Figure 14D:
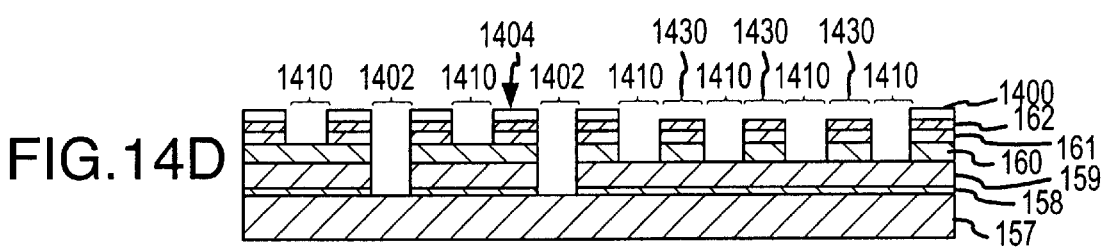

In FIG. 14D, first DLC etch stop layer 160 underlying first unmasked region 1402 is removed by exposure to oxygen dry etching, which also removes remaining intermediate resist features 1405, thereby creating third unmasked regions 1430. RGA is employed to halt the etch upon detection of etching of chrome layer 162 underlying the now-eliminated intermediate features.

Figure 14E:
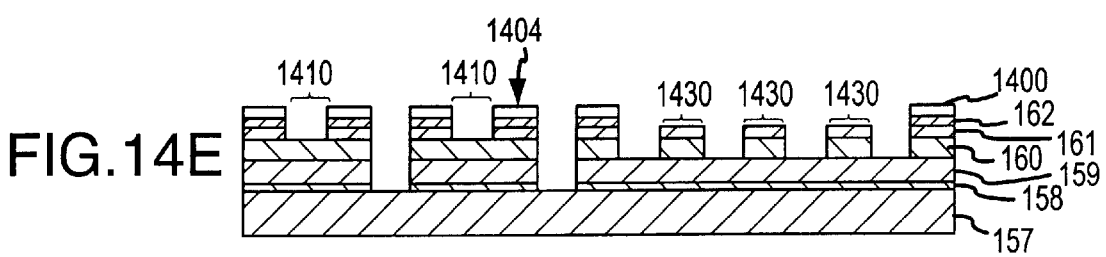

In FIG. 14E, chrome layer 162 in unmasked regions 1430 is removed by exposure to chlorine-based etchant to stop on underlying first oxide layer 161.

Figure 14F:
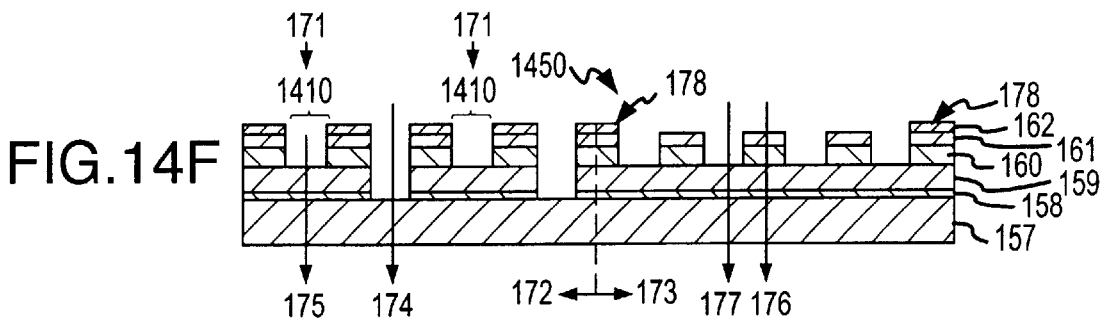

In FIG. 14F the remaining resist is removed by exposure to oxygen dry etching chemistry, which at the same time removes first DLC etch stop layer 160 underlying second unmasked regions 1410. The resulting iPSM structure 1450 illustrated in FIG. 14F comprises AAPSM 172 and EAPSM 173 features defined through gray-scale lithography and selective etches with etch stops. This embodiment implements layers with mutual etch selectivities that can simplify the fabrication process by allowing greater process tolerances. For the AAPSM region, the resulting structure has π-phase shifting and non-shifting features 174 and 175, respectively, that transmit incident light with a small or negligible amount of attenuation. For the EAPSM region, the resulting structure has π-phase shifting and attenuating feature 176, non-shifting and non-attenuating feature 177, and opaque bordering 178.

In a similar fashion, other RET features such as OPC can be implemented utilizing the steps described. When dry etching steps are applied, fabrication steps following the e-beam lithography can be applied without breaking the vacuum with appropriate in-situ optical and chemical monitoring.

Although the present invention has been described above in connection with specific embodiments, it must be understood that the invention as claimed should not be limited to these embodiments. Various modifications and alterations in the disclosed methods and apparatuses will be apparent to those skilled in the art without departing from the scope of the present invention.

For example, where a tuned absorption layer is utilized in conjunction with a phase compensating layer, these layers may be formed in any order so long as the desired cumulative phase shift in incident light is produced by the combined layers. Similarly, where multiple phase compensating and tuned absorption layers are employed in the same mask blank, these layers may be of any thickness so long as the combined film stack produces the desired phase shift and transmissive properties.

Given the variety of embodiments of the present invention just described, the above description and illustrations should not be taken as limiting the scope of the present invention defined by the claims.

What is claimed is:

1. A phase shift mask blank comprising:
   an optically transmissive substrate comprising one of quartz and glass;
   an etch stop layer overlying the optically transmissive substrate, the etch stop layer comprising a diamond-like carbon (DLC) film; and
   a phase-shift layer overlying the DLC etch stop layer and shifting a phase of transmitted light; the phase shift layer susceptible to a first etching process selective against the DLC etch stop layer, the DLC etch stop layer susceptible to a second etching process selective against the optically transmissive substrate.

2. The mask blank of claim 1 wherein the DLC film is formed by ion beam deposition.

3. The mask blank of claim 1 wherein the DLC film has a stress of 1 GPa or less.

4. The mask blank of claim 1 further comprising an optically opaque layer overlying the phase shift layer, the optically opaque layer susceptible to a third etching process selective against the phase shift layer.

5. The mask blank of claim 1 wherein the phase shift layer is selected from the group consisting of $SiO_2$, $HfO_2$, $TiO_2$, $ZrO_2$, $Al_2O_3$, $Si_3N_4$, and $Ta_2O_5$.

6. The mask blank of claim 1 wherein the phase-shift layer controls the phase of an incident optical beam for implementation of advanced lithography mask technologies.

7. The mask blank of claim 6 wherein the advanced lithography mask technologies comprise optical proximity compensation (OPC), embedded attenuated Phase Shift Mask (EAPSM), alternating aperture Phase Shift Mask (AAPSM), and various combinations thereof.

8. A phase shift mask blank comprising:
   an optically transmissive substrate selected from the group consisting of glass, quartz, fluorinated glass, and fluorinated quartz;
   a tuned absorption layer comprising diamond-like carbon (DLC) overlying the optically transmissive substrate layer, the tuned absorption layer altering an amplitude of transmitted light; and
   a phase-compensation-layer overlying the tuned absorption layer, the phase-compensation layer shifting a phase of transmitted light.

9. The mask blank of claim 8 wherein the DLC tuned absorption layer exhibits a stress of 1 GPa or less.

10. The mask blank of claim 8 wherein the phase compensation layer is selected from the group consisting of $SiO_2$, $HfO_2$, $TiO_2$, $ZrO_2$, $Si_3N_4$, $Ta_2O_5$, and $Al_2O_3$.

11. The mask blank of claim 8 wherein the phase-compensation layer and the tuned absorption layer control the phase and the amplitude of an incident optical beam for implementation of advanced lithography mask technologies.

12. The mask blank of claim 11 wherein the advanced lithography mask technologies comprise at least one of optical proximity compensation (OPC), embedded attenuated Phase Shift Mask (EAPSM), and alternating aperture Phase Shift Mask (AAPSM).

13. The mask blank of claim 8 wherein at least one of the phase-compensating layer and the tuned absorption layer provide at least one of additional phase-shift compensation of incident light, improved edge definition of structures formed by lithography, and etch control during patterning of the mask from the mask blank.

14. A phase shift mask blank comprising:
   an optically transmissive substrate;
   a first etch stop layer overlying the substrate;
   a phase shift layer overlying the first etch stop layer, the phase shift layer shifting a phase of transmitted light;
   an attenuation layer overlying the phase shift layer, the attenuation layer altering an amplitude of transmitted light; and
   a second etch stop layer overlying the attenuation layer.

15. The mask blank of claim 14 further comprising an optically opaque layer overlying the second etch stop layer.

16. The mask blank of claim 15 further comprising a layer of gray scale resist overlying the optically opaque layer.

17. The mask blank of claim 16 wherein the gray scale resist layer is an electron-beam sensitive resist.

18. The mask blank of claim 16 wherein the gray scale resist layer is an optical-beam-sensitive resist.

19. The mask blank of claim 14 wherein at least one of the attenuation layer and the first etch stop layer comprise a diamond-like carbon (DLC) film.

20. The mask blank of claim 14 wherein at least one of the phase shift layer and the second etch stop layer comprises one of one of $SiO_2$, $HfO_2$, $TiO_2$, $ZrO_2$, $Si_3N_4$, $Ta_2O_5$, and $Al_2O_3$.

21. The mask blank of claim 14 wherein the attenuation layer comprises DLC having a stress of 1 GPa or less.

22. The mask blank of claim 14 wherein the phase-compensating layer and the tuned absorption layer control the phase and the amplitude of an incident optical beam for implementation of at least one of optical proximity compensation (OPC), embedded attenuated Phase Shift Mask (EAPSM), and alternating aperture Phase Shift Mask (AAPSM) features.

23. The mask blank of claim 14 wherein at least one of the phase-shift layer and the attenuation layer provide at least one of additional phase-shift of transmitted light, etch control during fabrication of a mask structure from the mask blank, and improved edge definition of features formed by lithography utilizing the mask structure.

24. A process for forming a phase shift mask comprising:
   providing an optically transmissive substrate;
   forming a phase-shift layer over the optically transmissive substrate layer;
   forming an optically opaque layer over the phase-shift layer;
   removing the optically opaque layer selective to the underlying phase-shift layer; and
   removing the phase-shift layer selective to the underlying substrate.

25. The process of claim 24 wherein removing the optically opaque layer comprises:
   patterning a multilevel gray scale resist layer over the opaque layer; and
   etching regions exposed by the gray scale resist pattern.

26. The process of claim 25 wherein at least one of a clock frequency, a dwell time, and multi-passing of a radiation beam sweep are controlled during patterning of the multi-level gray scale resist layer such that only a portion of the resist is developed, with subsequent exposure to etchant creating mask features having different heights due to a remaining portion of the resist.

27. The process of claim 26 wherein the subsequent exposure to etchant comprises a single dry etching step utilizing changed gases without disruption of a vacuum etching environment.

28. The process of claim 26 wherein patterning the multilevel gray scale resist comprises forming a layer of electron-beam-sensitive resist and exposing the electron-beam-sensitive resist to an electron beam.

29. The process of claim 26 wherein patterning the multilevel gray scale resist comprises forming a layer of optical-beam-sensitive resist and exposing the optical-beam-sensitive resist to an optical beam.

30. The process of claim 26 wherein the subsequent exposure to etchant comprises a combination of wet and dry etching processes.

31. The process of claim 25 wherein patterning the multilevel resist comprises developing only a portion of the resist utilizing a development recipe comprising a developer concentration, a development time and a development temperature, with subsequent exposure to etchant creating mask features having different heights due to a remaining portion of the resist.

32. The process of claim 31 wherein the subsequent exposure to etchant comprises a single dry etching step utilizing changed gases without disruption of a vacuum etching environment.

33. The process of claim 31 wherein the subsequent exposure to etchant comprises a combination of wet and dry etching processes.

34. The process of claim 31 wherein patterning the multilevel gray scale resist comprises forming a layer of electron-beam-sensitive resist and exposing the electron-beam-sensitive resist to an electron beam.

35. The process of claim 31 wherein patterning the multilevel gray scale resist comprises forming a layer of optical-beam-sensitive resist and exposing the optical-beam-sensitive resist to an optical beam.

36. The process of claim 24 wherein:
providing a substrate comprises providing a substrate of one of fluorinated glass or $CaF_2$;
forming a phase-shift layer comprises forming a layer of oxide;
forming an opaque layer comprises forming a layer of chrome;
removing the optically opaque layer comprises patterning a multilayer mask of resist and exposing unmasked opaque regions to chlorine-based plasma; and
removing the phase-shift layer comprises exposing the unmasked phase shift regions to fluorine-based plasma.

37. The process of claim 24 further comprising forming a first etch stop layer over the substrate prior to forming the phase shift layer.

38. The process of claim 37 wherein:
providing a substrate comprises providing a substrate of one of glass or quartz;
forming an etch stop layer comprises forming a layer of diamond-like carbon;
forming a phase-shift layer comprises forming a layer of silicon dioxide;
forming an opaque layer comprises forming a layer of chrome;
removing the optically opaque layer comprises patterning a mask of resist and exposing unmasked opaque regions to chlorine-based plasma; and
removing the phase-shift layer comprises exposing the unmasked phase shift regions to fluorine-based plasma.

39. The process of claim 24 further comprising:
forming an attenuation layer over the phase shift layer prior to forming the opaque layer;
removing the attenuation layer selective to the underlying phase shift layer; and
removing the phase shift layer selective to the underlying substrate.

40. The process of claim 39 wherein removing the optically opaque layer comprises:
patterning a multilevel gray scale resist layer over the opaque layer; and
etching regions exposed by the gray scale resist.

41. The process of claim 40 wherein:
providing a substrate comprises providing a substrate of one of glass or quartz;
forming a phase shift layer comprises forming a layer of silicon dioxide;
forming an attenuating layer comprises forming a layer of diamond-like carbon (DLC);
forming an opaque layer comprises forming a layer of chrome;
removing the optically opaque layer comprises patterning a mask of resist and exposing unmasked opaque chrome regions to chlorine-based plasma;
removing the attenuation layer comprises exposing unmasked DLC attenuation regions to oxygen-based plasma; and
removing the phase shift layer comprises exposing unmasked silicon oxide phase shift regions to fluorine-based plasma.

42. The process of claim 41 further comprising:
forming a first etch stop layer over the substrate prior to forming the phase shift layer,
forming a second etch stop layer over the attenuation layer prior to forming the optically opaque layer;
removing the second etch stop layer selective to the attenuation layer; and
removing the first etch stop layer selective to the substrate.

43. The process of claim 42 wherein:
providing a substrate comprises providing a substrate of one of glass or quartz;
forming a first etch stop layer comprises forming a fluorine-based etch resistant material;
forming a phase shift layer comprises forming a layer of silicon dioxide;
forming an attenuating layer comprises forming a layer of diamond like carbon;
forming a second etch stop layer comprises forming a chlorine-based etch resistant material;
forming an opaque layer comprises forming a layer of chrome;
removing the optically opaque layer comprises patterning a mask of resist and exposing unmasked opaque regions to chlorine-based plasma;

removing the second etch stop layer comprises exposing unmasked second etch stop regions to fluorine-based plasma;

removing the attenuation layer comprises exposing unmasked attenuation regions to oxygen-based plasma;

removing the phase shift layer comprises exposing unmasked phase shift regions to fluorine-based plasma; and removing the first etch stop layer comprises exposing unmasked first etch stop regions to oxygen-based plasma.

44. The process of claim 40 wherein etching regions exposed by the gray scale resist produces an integrated phase shift mask comprising alternating aperture phase shift mask (AAPSM) portion in a first mask region and an embedded-attenuating phase shift mask (EAPSM) portion in a second mask region.

45. The process of claim 24 further comprising forming a tuned absorption layer between the substrate and the phase shift layer, wherein removing the phase shift layer comprises:

patterning a first resist layer over the opaque layer, the first resist layer defining a first unmasked region;

etching the opaque layer, the phase shift layer, and the tuned absorption layer in the first unmasked region;

removing the first resist layer;

patterning a second resist layer to form a second unmasked region larger than and encompassing the first unmasked region;

etching the opaque layer and the phase shift layer to stop on the tuned absorption layer in the second unmasked region; and removing the second resist layer.

46. The process of claim 45 wherein forming a tuned absorption layer comprises forming a DLC layer between a quartz substrate and a silicon oxide phase shift layer.

47. The process of claim 46 wherein the opaque layer is susceptible to etching selective to the phase shift layer, the phase shift layer is susceptible to etching selective to the tuned absorption layer, and the tuned absorption layer is susceptible to etching selective to the substrate.

48. A method of fabricating a semiconductor device, the method comprising:

providing an optically transmissive substrate;

forming a phase-shift layer over the optically transmissive substrate;

forming an optically opaque layer over the phase-shift layer;

removing the optically opaque layer selective to the underlying phase-shift layer;

removing the phase-shift layer selective to the underlying substrate to form a multi-layer phase shift mask;

transmitting radiation through portions of the multi-layer phase shift mask to expose a pattern of photoresist overlying a semiconductor workpiece; and utilizing the patterned photoresist to fabricate a semiconductor device.

49. The method of claim 48 further comprising:

forming an attenuation layer over the phase shift layer prior to forming the opaque layer; and removing the attenuation layer selective to the underlying phase shift layer; and removing the phase shift layer selective to the underlying substrate.

50. The method of claim 49 wherein removing the optically opaque layer comprises:

patterning a multilevel gray scale resist layer over the opaque layer; and etching regions exposed by the gray scale resist.

51. A semiconductor device formed by, providing an optically transmissive substrate;

forming a phase-shift layer over the optically transmissive substrate;

forming an optically opaque layer over the phase-shift layer;

removing the optically opaque layer selective to the underlying phase-shift layer;

removing the phase-shift layer selective to the underlying substrate to form a multi-layer phase shift mask;

transmitting radiation through portions of the multi-layer phase shift mask to expose a pattern of photoresist overlying a semiconductor workpiece; and utilizing the patterned photoresist to fabricate a semiconductor device.

52. The semiconductor device of claim 51 created by further forming an attenuation layer over the phase shift layer prior to forming the opaque layer, removing the attenuation layer selective to the underlying phase shift layer, and removing the phase shift layer selective to the underlying substrate.

53. The semiconductor device of claim 52 created by further patterning a multilevel gray scale resist layer over the opaque layer, and etching regions exposed by the gray scale resist to remove the optically opaque layer selective to the underlying phase-shift layer and to remove the phase-shift layer selective to the underlying substrate.

* * * * *